United States Patent [19]
Shyr et al.

[11] Patent Number: 5,903,764
[45] Date of Patent: May 11, 1999

[54] SMART BATTERY SELECTOR OFFERING POWER CONVERSION INTERNALLY WITHIN A PORTABLE DEVICE

[75] Inventors: You-Yuh Shyr, San Jose; Kwang H. Liu, Sunnyvale; Sterling Du, Palo Alto, all of Calif.

[73] Assignee: Micro International, Ltd., Taipei, Taiwan

[21] Appl. No.: 08/850,335

[22] Filed: May 2, 1997

[51] Int. Cl.$^6$ .............................. G06F 1/00; H01M 10/44; H02J 7/04
[52] U.S. Cl. .................... 395/750.01; 320/106; 320/124; 320/128; 320/134; 320/162; 320/164; 307/64
[58] Field of Search .................................. 320/48, 15, 6, 320/106, 162, 164, 124, 128, 134, DIG. 21; 307/64; 395/750.01

[56] References Cited

U.S. PATENT DOCUMENTS

| | | | |
|---|---|---|---|
| 5,565,759 | 10/1996 | Dunstan | 320/48 |
| 5,606,242 | 2/1997 | Hull et al. | 320/48 |
| 5,640,078 | 6/1997 | Kou et al. | 320/15 |
| 5,684,384 | 11/1997 | Barkat et al. | 320/6 |
| 5,734,254 | 3/1998 | Stephens | 320/106 |

OTHER PUBLICATIONS

*System Management Bus Specification*, Revision 1.0, Feb. 15, 1995, Copyright 1996.
*System Management Bus BIOS Interface Specification*, Revision 1.0, Feb. 15, 1995, Copyright 1996.
*Smart Battery Charger Specification*, Revision 1.0, Jun. 27, 1996, Copyright 1996.
*Smart Battery Data Specification*, Revision 1.0, Feb. 15, 1995, Copyright 1996.
*Smart Battery Selector Specification*, Revision 1.0, Sep. 5, 1996, Copyright 1996.

*Primary Examiner*—Ayaz R. Sheikh
*Assistant Examiner*—Frantz Blanchard Jean
*Attorney, Agent, or Firm*—Donald E. Schreiber

[57] ABSTRACT

A controller for a smart battery selector included in a portable device has a plurality of switch-drivers at least equal to a plurality of smart batteries. The batteries provide battery-state data via a bus to a host computer included in the portable device. Each switch-driver effects selection of an associated battery. A control electronic-circuit in the controller directs operation of the switch-drivers for selecting the battery so that at any instant only one battery powers the portable device. A bus-snooper circuit permits the controller to independently monitor the bus for battery-condition alarm-messages. The controller may respond to such messages by selecting a different battery. The controller may also select a single battery for recharging, and may terminate charging upon receiving a battery overcharge message.

16 Claims, 18 Drawing Sheets

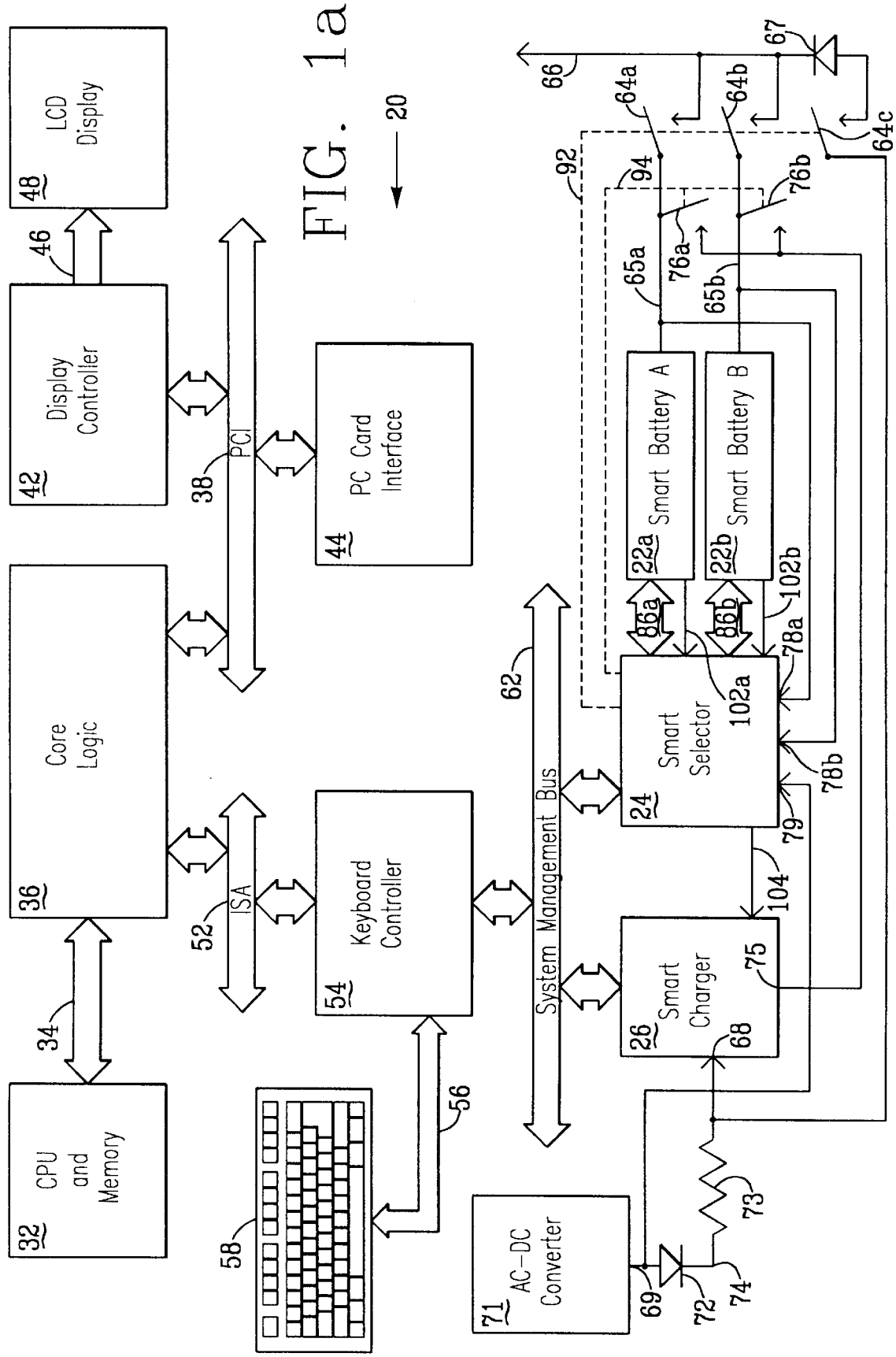

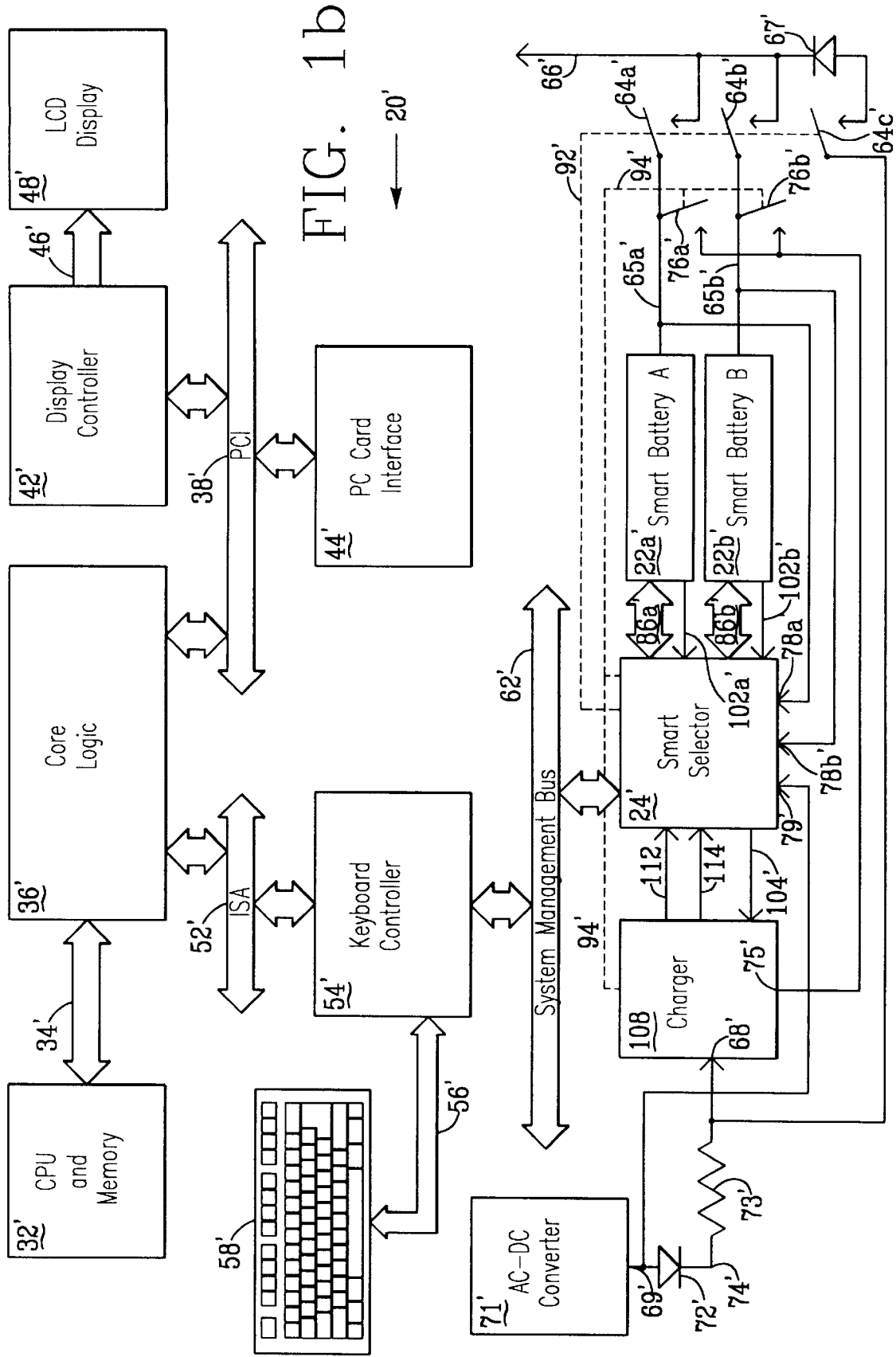

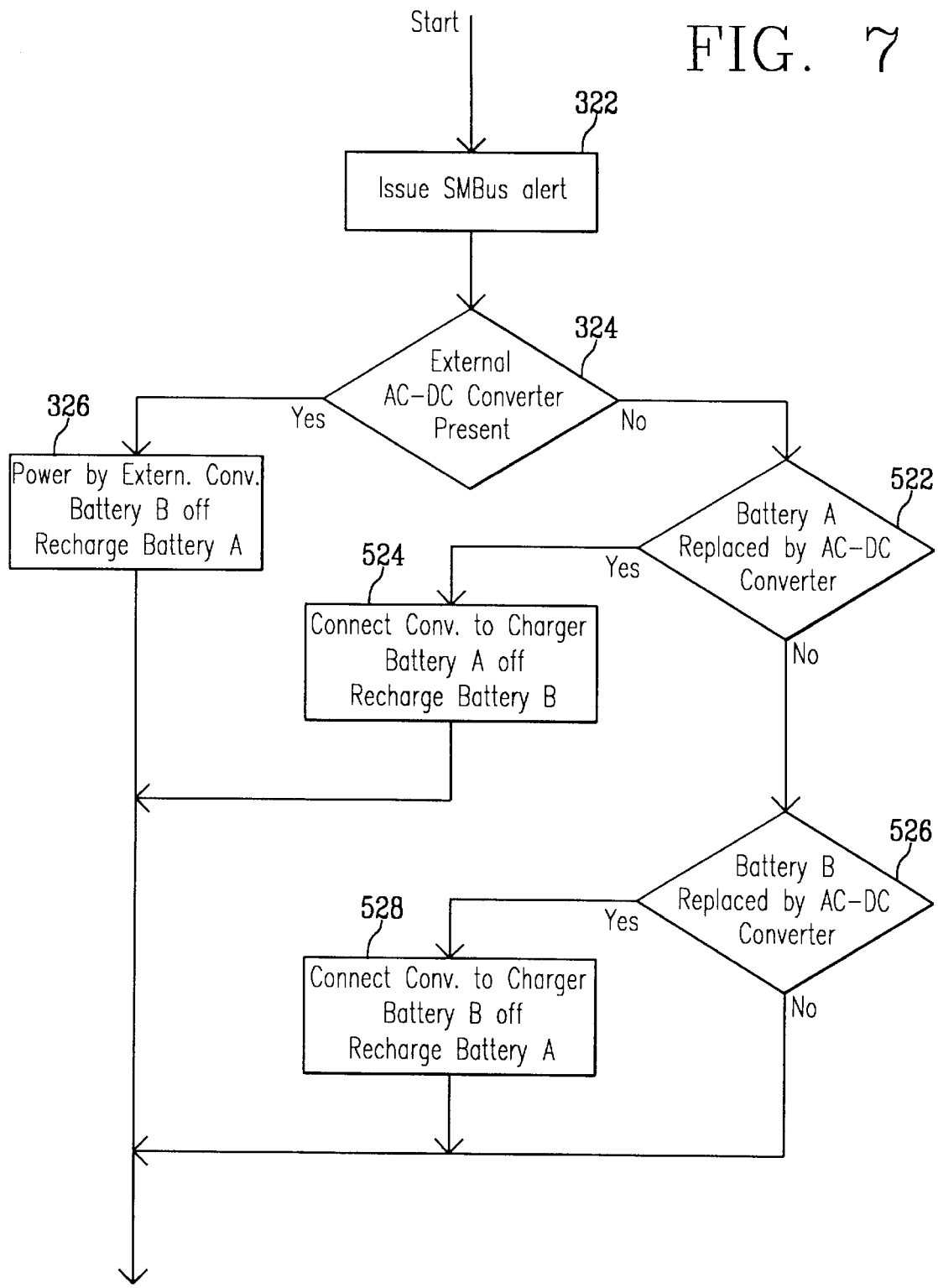

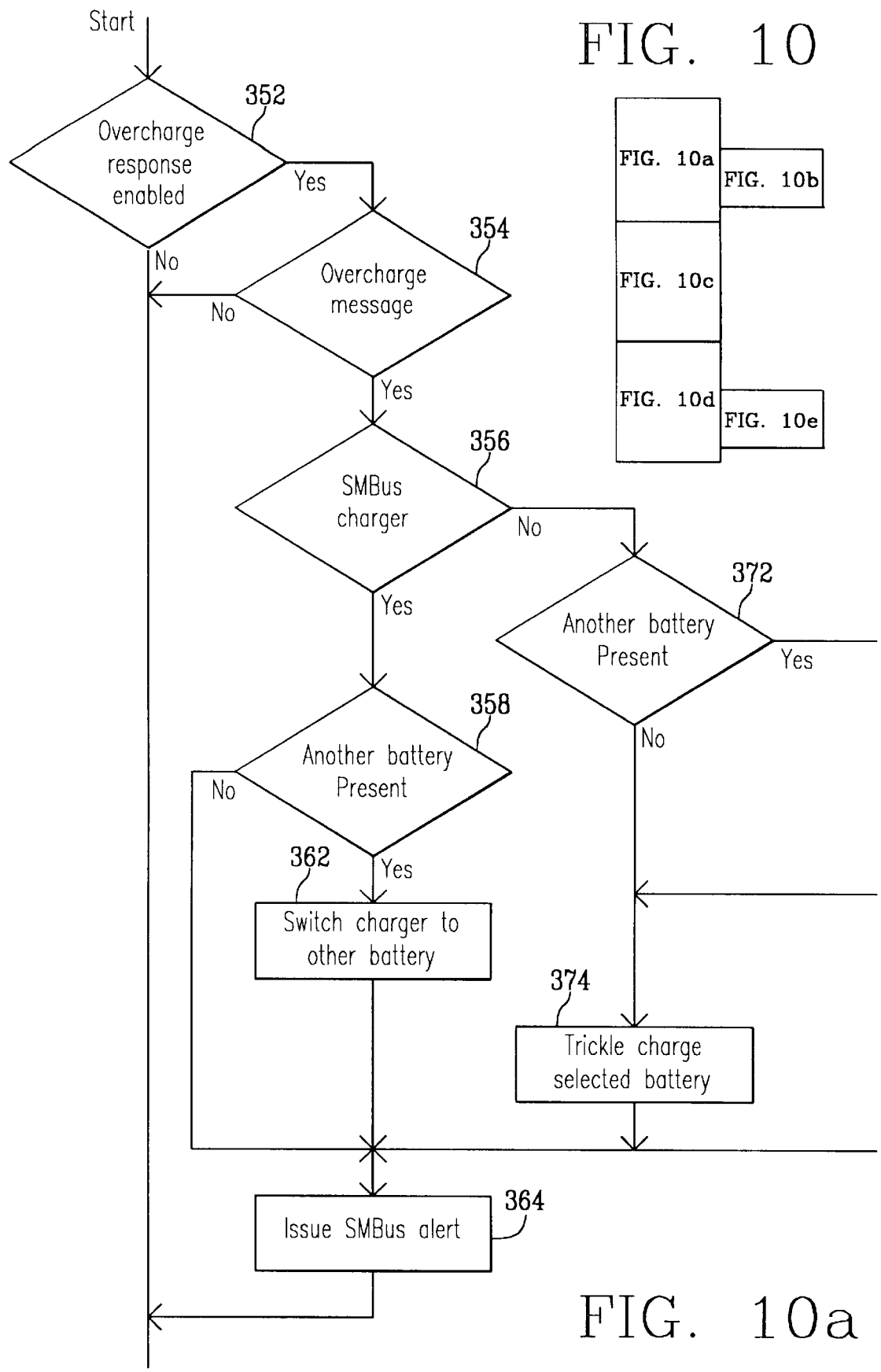

SMART BATTERY SELECTOR OFFERING POWER CONVERSION INTERNALLY WITHIN A PORTABLE DEVICE

BACKGROUND OF THE INVENTION

1. Field of the Invention

The present invention relates generally to battery power for electrical devices, and, more particularly, to enhancing battery operation of portable electrical devices.

2. Description of the Prior Art

Presently, the performance obtainable from various different types of portable devices, such as laptop or notebook computers, cellular telephones, and video cameras, depends crucially upon electrical performance of batteries. In such applications, conventional batteries impose a number of limitations including being an unreliable source of electrical power. For example, conventional batteries provide little advance warning that they are about to completely discharge, or any indication of remaining operating time. Furthermore, battery powered equipment cannot determine if a battery's present electrical capacity is sufficient to power an additional electrical load, such as starting a hard disk drive included in a laptop or notebook computer. Finally, conventional battery chargers must be individually tailored for a particular type of battery chemistry, e.g. NiMH, Li-ion, Lithium Polymer, etc. Attempting to recharge a battery with the wrong type of charger may damage either the charger or the battery.

Recently, a new system has been specified for use in battery powered portable devices that is identified as the System Management Bus ("SMBus"). The SMBus prescribes data protocols, device addresses, and additional electrical requirements necessary to transport commands and information among various subsystems of a battery powered device. The SMBus specification envisions the SMBus interconnecting at least a system host computer, a smart battery charger, and a smart battery that are all included in the portable device. Under the SMBus protocol, the smart battery provides data, via the SMBus, to the portable device's host computer. A power management routine executed by the host computer processes such smart battery data to manage operation of at least the smart battery and the smart battery charger.

In accordance with the SMBus specification and protocol, a smart battery accurately reports its characteristics to the host computer via the SMBus. If a portable device includes more than one battery, each battery reports such characteristics independently via the SMBus. Providing the power management routine executed by the host computer with information about the charge state of each battery permits displaying the batteries' charge states, and accurately estimating the portable device's remaining operating time. However, in addition to providing information about the batteries' charge state, the information obtained via the SMBus is sufficient to permit electrical power management for the portable device, and to also permit controlling battery re-charging regardless of a battery's particular chemistry.

To achieve the preceding objectives, the SMBus specifies that, independent of host computer power management routine operation, a smart battery charger must periodically poll a smart battery that is being recharged for the battery's charging characteristics. Upon receiving a response from the smart battery, the smart battery charger then adjusts its output to match the smart battery's requirements. To avoid battery damage, the smart battery also reports certain conditions such as over charge, over voltage, over temperature, and too rapid temperature increase to the smart battery charger. In this way the smart battery effectively controls its charging cycle. Moreover, to prolong smart battery life, the smart battery charger may prevent a fully charged smart battery from powering the portable device if a source of external electrical power is available.

Analogously, the power management routine executed by the host computer may poll the smart battery, that powers the host computer's operation, for smart battery information. The power management routine can request factual information about the battery such as the battery's chemistry, or the battery's operating temperature, voltage, or charge or discharge current. The power management routine can either display such information directly, or it may process such information for use in the computer system's power management scheme, and/or to display an estimate of the battery's operating capabilities. Similar to the smart charger, the power management routine receives information about critical events if the smart battery detects a problem. Moreover, the power management routine also receives smart battery estimates about end of discharge, electrical capacity remaining below a preset threshold value, and time remaining until discharge below a preset threshold value.

As part of the host computer's power management scheme, the power management routine may provide other routines with information about battery condition. Accordingly, the power management routine may query a device driver routine to determine if an anticipated action will endanger the host computer's electrical power integrity. For example, before attempting to start a hard disk drive the power management routine may first determine if that particular operation might cause the smart battery's output voltage to drop below a threshold for host computer failure. Under such circumstances, the hard disk device driver's response might be to increase power available for starting the hard disk drive by causing the power management routine to turn-off a non-critical power use such as liquid crystal display ("LCD") backlighting.

In addition to a smart battery and a smart charger, a portable device that implements the SMBus must also include a smart battery selector. The SMBus specification and protocol includes a smart battery selector because a portable device may include two or more smart batteries, only one of which may be in use for powering the portable device's operation at any instant in time. In such multi-battery devices, the smart battery selector must arbitrate between or among batteries. Furthermore, the smart battery selector must be capable of swiftly re-configuring the portable devices power if a battery were to be suddenly removed, such as might occur if a battery were removed from a laptop or notebook computer to install a floppy diskette drive.

The simultaneous presence of two or more batteries in a portable device imposes certain operating constraints on the smart battery selector. For example, when a portable device operates from battery power, electrical power must come only from a single battery. All other batteries must be electrically isolated from the operating battery to avoid a possibility of high-current conditions that may occur if two or more batteries having differing electrical characteristics or states are simply connected in parallel. Moreover, the smart battery selector must couple to the SMBus the battery which is supplying power to the portable device so critical battery messages may be communicated between that smart battery and the power management routine executed by the host computer. However, the smart battery selector must also permit interrogation of other batteries by the power management routine so it can determine those batteries' capacity, etc. without interfering with the normal operation of the smart battery that is powering the portable device's operation. Furthermore, the smart battery selector must notify the power management routine about changes in electrical power configuration such as removal of a battery, or connection of a battery charger to the portable device.

Operation of a portable device from an external source of electrical power imposes additional constraints upon the smart battery selector's operation in addition to those set forth above that occur during battery powered operation. For example, the electrical power output from all batteries must be isolated from the external electrical power to avoid uncontrolled electrical currents into or out of the smart batteries. If one of the smart batteries is being charged, the smart battery selector must also properly couple that smart battery's SMBus, together with a thermistor included in the smart battery, to the smart battery charger so that smart battery controls its charging cycle. Finally, upon disconnection or failure of the source of external electrical power, the smart battery selector must immediately supply the portable device with electrical power from one of the smart batteries, and concurrently notify the power management routine executed by the host computer about the change.

Additional, more detailed information about the SMBus specifications and protocol, and about smart batteries is provided by:

System Management Bus Specification, Revision 1.0, Intel, Corporation, Feb. 15, 1995;

System Management Bus BIOS Interface Specification, Revision 1.0, Intel, Corporation, Feb. 15, 1995;

Smart Battery Charger Specification Revision 1.0, Duracell Inc. and Intel Corporation, Jun. 27, 1996;

Smart Battery Data Specification Revision 1.0, Duracell Inc. and Intel Corporation, Feb. 15, 1995; and Smart Battery Selector Specification Revision 1.0, Duracell Inc. and Intel Corporation, Sep. 5, 1996.

The publications listed above are hereby incorporated herein by reference as though fully set forth here.

While the SMBus specification and protocol addresses many significant problems experienced with battery powered operation of portable devices, it fails to address other significant operational constraints. For example, to facilitate controlling power consumption in portable personal computers such as laptop or notebook computers, microprocessors manufactured by Intel Corporation of Santa Clara, Calif. provide a System Management Mode ("SMM") of operation. SMM in these microprocessors provides a separate environment for the execution of power management routines that is completely independent of the environment in which the operating system and application programs execute. For such microprocessors, a special system management interrupt ("SMI") activates the SMM operating environment. For example, power management routines executed in SMM in response to specific SMIs may cause the personal computer to enter a "Suspend" mode of operation operating in the "Suspend" mode, the computer consumes a lesser amount of electrical power because certain parts of the computer are turned off, e.g. the display and any back-lighting for the display, the hard disk, the modem, etc. In a particular "Suspend" operating mode, the microprocessor itself receives no electrical power. Restoring the microprocessor's operation from this extremely low power "Suspend" operating mode requires full operation of a hard disk drive included in the computer, and retrieval from the hard disk of data essential to restoring and resuming computer program execution. However, if the host computer included in laptop or notebook computer begins operating in its lower power; "Suspend" operating mode, the power management routine cannot detect or respond to SMBus messages from the smart battery that powers the host computer's operation. Consequently, under such circumstances the host computer's power management routine will miss or loose SMBus messages from the smart battery which seek to inform the power management routine that the battery which powers the computer's operation is about to become discharged.

Another nuisance associated with many battery powered devices, such as laptop or notebook computers, is the need to carry a AC-DC converter that is separate from the computer itself. Such battery powered devices require an external AC-DC converter so they may operate from an external power source, and for recharging the laptop or notebook computer's batteries.

SUMMARY OF THE INVENTION

An object of the present invention is to provide a controller for a smart battery selector that, while a portable device's batteries retain electrical power, is capable of automatically selecting a particular battery to supply the device's electrical power even if a host computer begins operating in a lower power, "Suspend" operating mode.

Another object of the present invention is to provide a battery powered device which is capable of automatically selecting a particular battery from among two or more batteries to supply the computer's electrical power even if the computer begins operating in a lower power, "Suspend" operating mode.

Another object of the present invention is to provide a controller for a smart battery selector that is capable of responding automatically to a battery overcharge condition even while the host computer operates in a lower power, "Suspend" operating mode.

Another object of the present invention is to provide a battery powered device which is capable of automatically responding to a battery overcharge condition even if the computer begins operating in a lower power, "Suspend" operating mode.

Another object of the present invention is to permit replacement of a battery normally included in a portable device with an AC-DC converter, which AC-DC converter may then power the device's operation, and also recharge any batteries remaining in the device.

Briefly, a controller for a smart battery selector in accordance with the present invention includes a plurality of switch-drivers at least equal in number to a plurality of smart batteries included in a portable device. In addition to providing electrical power for energizing the portable device's operation, the smart batteries provide battery-state data via a bus to a host computer included in the portable device. Each switch-driver in the controller is associated with a particular smart battery, and provides a battery selection-signal for effecting a selection of the associated smart battery. The controller also includes a control electronic-circuit that directs operation of the switch-drivers for selecting the smart battery associated with a particular switch-driver. The control electronic-circuit directs operation of the switch-drivers so that at any instant only one of the plurality of switch-drivers effects selection of the associated smart battery for providing electrical power.

The controller also includes a bus-snooper circuit that, upon activation by data stored into the controller by a power management routine executed by the host computer, permits the controller to independently monitor the bus for battery-condition alarm-messages. Upon the bus-snooper circuit's detection of a battery-condition alarm-message, the bus-snooper circuit transmits a signal to the control electronic-circuit which, under appropriate conditions, responds to such signal by causing the switch-drivers to select a different smart battery.

If the battery-condition alarm-message detected by the bus-snooper circuit is a low-battery-capacity message, the signal transmitted by the control electronic-circuit in response to the signal from the bus-snooper circuit causes selection of a different smart battery for providing electrical power for energizing the operation of the portable device. Alternatively, if an external power-source is connected to the portable device, the control electronic-circuit may cause the switch-drivers to select the external electrical power-source for providing electrical power for energizing the operation of the portable device.

In addition to switch-drivers for selecting an electrical power source, the controller in a preferred embodiment also includes other switch-drivers for selecting a battery for recharging. The battery switch-drivers, operating under direction of the control electronic-circuit, select only one of the smart batteries for recharging so that at any instant only one smart battery is being recharged. If the battery-condition alarm-message detected by the bus-snooper circuit is a battery overcharge message, then the signal transmitted by the control electronic-circuit in response to the signal from the bus-snooper circuit causes the switch-drivers to select a different smart battery for recharging.

These and other features, objects and advantages will be understood or apparent to those of ordinary skill in the art from the following detailed description of the preferred embodiment as illustrated in the various drawing figures.

BRIEF DESCRIPTION OF THE DRAWINGS

FIG. 1a is a block diagram depicting a digital computer system that includes smart batteries, a smart selector and a smart-battery charger;

FIG. 1b is a block diagram depicting a digital computer system that includes smart batteries, a smart selector and a charger;

FIG. 7 is a decisional flow chart for operation of the event-driven state machine included in the selector controller immediately following connection of AC-DC converter to the digital computer system;

DETAILED DESCRIPTION OF THE PREFERRED EMBODIMENTS

Figure 2A:
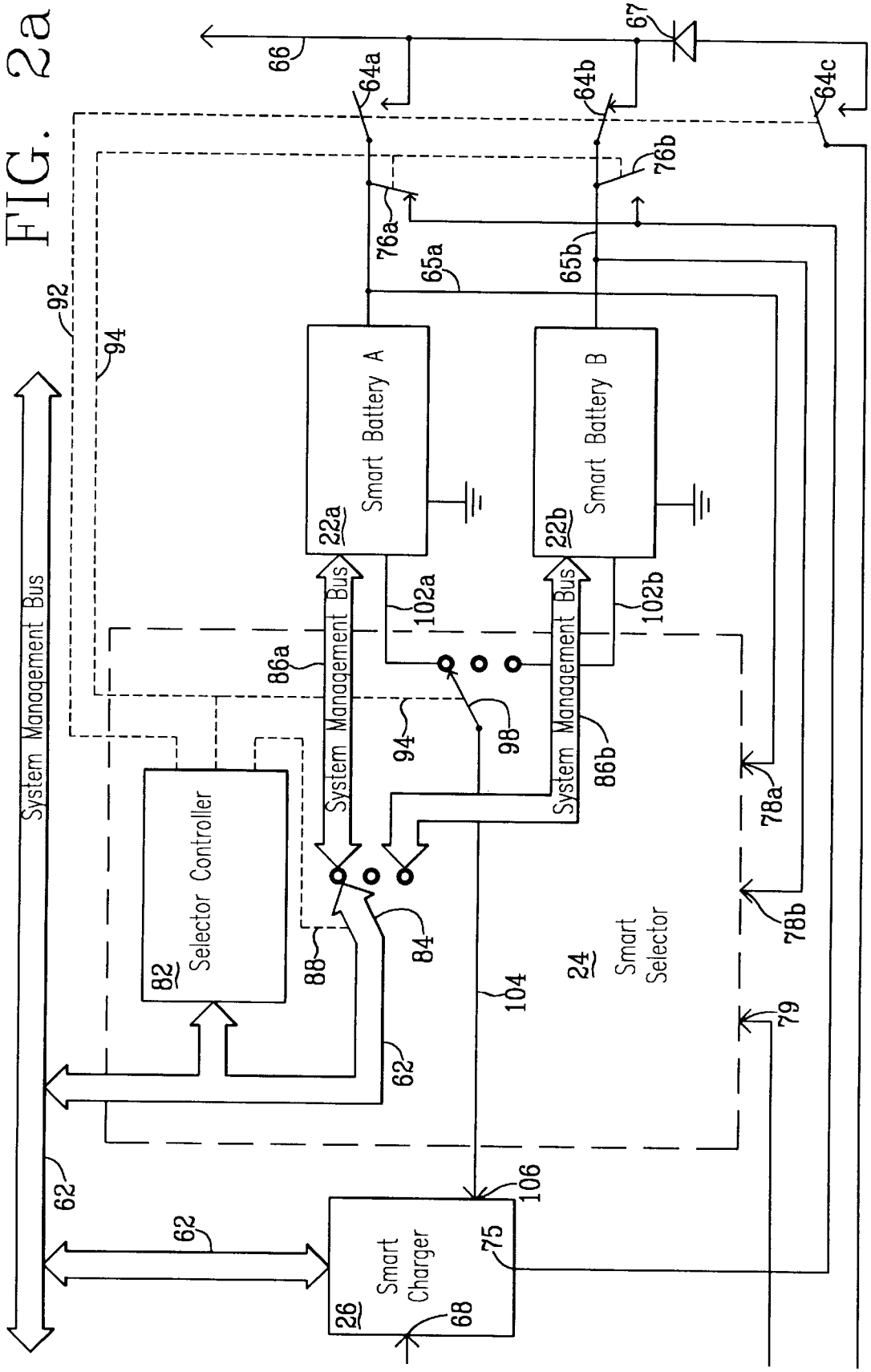
FIG. 2a is a block diagram depicting the smart batteries, the smart selector, and the smart battery charger of FIG. 1a together with a selector controller and switches that effect the battery system's operation.

Referring now to FIG. 1a, depicted there is a block diagram of a battery-powered, portable laptop or notebook digital computer system, referred to by the general reference character 20. The computer system 20 includes smart batteries 22a and 22b, a smart selector 24, and a smart-battery charger 26. The computer system 20 also includes a conventional central processing unit ("CPU") and memory 32 that is coupled by a CPU bus 34 to a core logic integrated circuit ("IC") 36. The core logic IC 36 is coupled by a Peripheral Component Interconnect ("PCI") bus 38 to a display controller IC 42, and to a PC Card (f/k/a Personal Computer Memory Card International Association ("PCMCIA")) interface IC 44. The display controller IC 42 is coupled by a display bus 46 to a liquid crystal display ("LCD") screen 48. In addition to being coupled to the PCI bus 38, the core logic IC 36 is also coupled by an Industry Standard Architecture ("ISA") bus 52 to a keyboard controller IC 54. A keyboard bus 56 couples the keyboard controller IC 54 to a keyboard 58.

To permit data communication between the various computing elements included in the computer system 20 that have been identified above and the smart batteries 22a and 22b that energize operation of the computer system 20, a system management bus ("SMBus") 62 couples the keyboard controller IC 54 both to the smart selector 24 and to the smart-battery charger 26. Thus, the smart batteries 22a and 22b, the smart selector 24 and the smart-battery charger 26 may transmit SMBus messages, via the SMBus 62 to the keyboard controller IC 54 which relays such messages via the ISA bus 52, the core logic IC 36 and the CPU bus 34, to the CPU and memory 32.

Figure 2B:
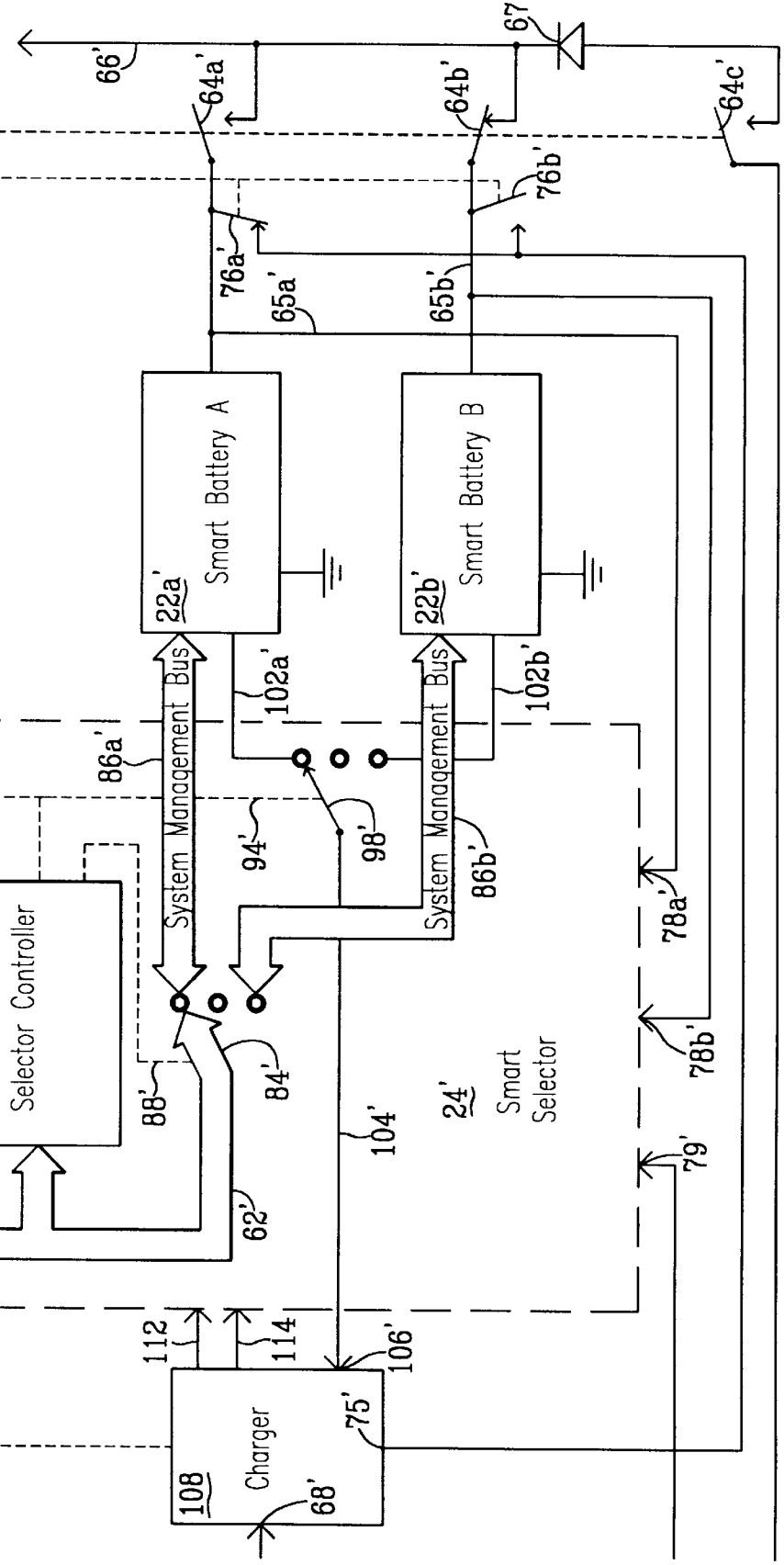
FIG. 2b is a block diagram depicting the smart batteries, the smart selector, and the battery charger of FIG. 1b together with a selector controller and switches that effect the battery system's operation.

As illustrated in FIG. 1a, an operating-power switch 64a or 64b may couple a battery-terminal lines 65a or 65b from each of the smart batteries 22a or 22b respectively to a main power-bus 66 of the computer system 20. (As illustrated in FIGS. 2a and 2b, a second power terminal of each of the smart batteries 22a or 22b is coupled to circuit ground of the computer system 20.) The main power-bus 66 may also be coupled through a series connected main-power-bus protection-diode 67 and an operating-power switch 64c to a power-input terminal 68 of the smart-battery charger 26. The in the embodiment of the computer system 20 depicted in FIGS. 1a and 1b, the power-input terminal 68 receives electrical power from an output terminal 69 of an AC-DC converter 71 via a protection diode 72 and resistor 73 that are connected in series at a node 74. The AC-DC converter 71 may either be included in the computer system 20, or be coupled to the computer system 20 by a power cable that is not separately illustrated in any of the FIGS. Electrical power supplied to the main power-bus 66 either from one of the smart batteries 22a or 22b or from the AC-DC converter 71, respectively through one of the operating-power switches 64a, 64b or 64c, energizes operation of the computer system 20.

In addition to coupling the battery-terminal lines 65a or 65b to the main power-bus 66 through the operating-power switch 64a or 64b, the battery-terminal lines 65a or 65b from each of the smart batteries 22a and 22b may also be coupled to an output terminal 75 of the smart-battery charger 26 respectively through a battery-recharge switch 76a or 76b. The battery-terminal lines 65a and 65b are also coupled respectively to battery-voltage input-terminals 78a and 78b of the smart selector 24. An AC-power-sensing input 79 of the smart selector 24 is coupled directly to the output terminal 69 of the AC-DC converter 71.

Referring now to FIG. 2a, the SMBus 62 is coupled within the smart selector 24 to a selector controller 82, and to a SMBus selector-switch 84. A battery SMBus 86a or 86b respectively interconnects the smart battery 22a or 22b with the SMBus selector-switch 84 within the smart selector 24. Responsive to control signals from the selector controller 82, indicated by a dashed line 88 in FIG. 2a, the SMBus selector-switch 84 may couple either one or the other of the smart batteries 22a or 22b to the SMBus 62. Similarly, power-switch control-signals 92 and battery-recharge control-signals 94, indicated by dashed lines in FIG. 1a that originate at the selector controller 82, respectively control the operating-power switches 64a, 64b and 64c for supplying electrical power to the main power-bus 66, and the battery-recharge switches 76a and 76b for recharging the smart batteries 22a and 22b. As depicted in FIG. 2a, the battery-recharge control-signals 94 from the selector controller 82 also operate a thermistor selector-switch 98 in synchronism with the battery-recharge switches 76a and 76b. The thermistor selector-switch 98 receives an electrical signal from a thermistor included in each of the smart batteries 22a and 22b respectively via thermistor output-signal-lines 102a and 102b. Via a thermistor input-signal-line 104, the thermistor selector-switch 98 transmits one or the other of these two signals from the smart battery 22a or 22b, that is being recharged, to a thermistor-signal input-terminal 106 of the smart-battery charger 26.

Referring now to FIG. 1b, depicted there is a block diagram of an alternative embodiment battery-powered, portable laptop or notebook digital computer. Those elements depicted in FIG. 1b that are common to the computer system 20 depicted in FIG. 1a carry the same reference numeral distinguished by a prime ("'") designation. The computer system 20' depicted in FIG. 1b differs from the computer system 20 depicted in FIG. 1a primarily in that the computer system 20' lacks the smart-battery charger 26. Rather, the computer system 20' replaces the smart-battery charger 26 with a conventional charger 108. Depending upon details of the design of the computer system 20', the conventional charger 108 may be either a single battery or a dual battery charger. In the computer system 20', the selector controller 82 also supplies via the battery-recharge control-signals 94 a control signal for activating the charger 108. Because the computer system 20' has only a conventional charger 108 that is not coupled to the SMBus 62', the charger 108 is coupled to the smart selector 24 by a single fast-charging-rate signal-line 112 if the charger 108 is a single battery charger, and by both the fast-charging-rate signal-line 112 and a second fast-charging-rate signal-line 114 if the charger 108 is a dual battery charger. Signals present on the signal-lines 112 and 114 indicate whether the smart batteries 22a and 22b are being recharged at a fast rate, or are receiving only a trickle charge.

Figure 3:
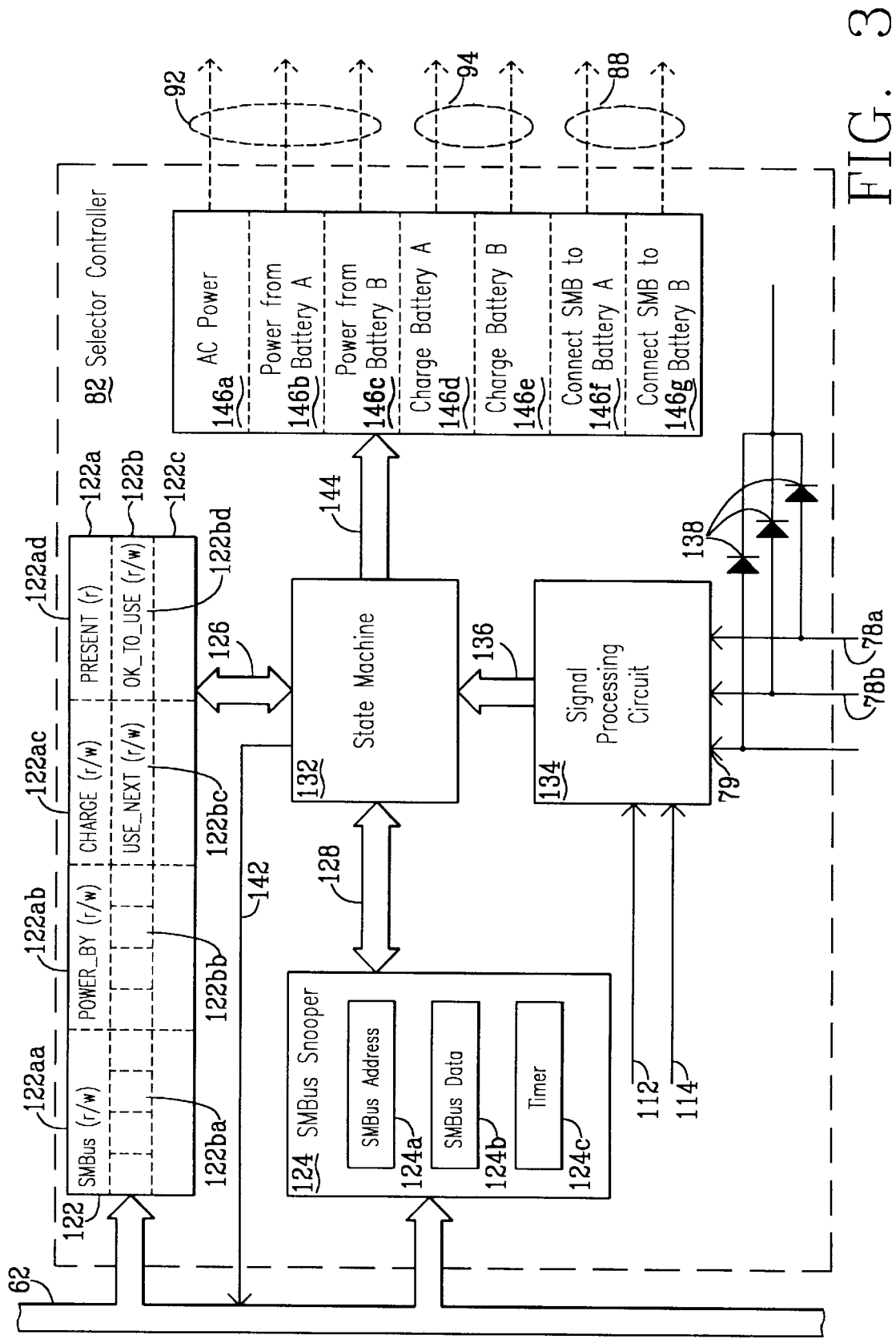
FIG. 3 is a block diagram depicting a selector controller included in the smart selectors respectively depicted in FIGS. 2a and 2b.

As illustrated in FIG. 3, the selector controller 82 includes three sixteen (16) bit registers 122 to permit communication between the selector controller 82 and a power-management routine computer program executed by the CPU included in the CPU and memory 32. In accordance with the SMBus specification, the registers 122 include a selector state register 122a, selector preset register 122b, and a selector support register 122c. Via the SMBus 62, a power-management routine computer program executed by the CPU included in the CPU and memory 32 may access the registers 122. Access to the registers 122 permits the power-management routine computer program executed by the CPU included in the CPU and memory 32 to monitor the status of the smart selector 24 and of the smart batteries 22a and 22b, and to exercise power-management for the computer system 20.

The selector controller 82 also includes a bus-snooper circuit 124 that is also coupled to the SMBus 62. A SMBus address register 124a included in the bus-snooper circuit 124 contains the address of the keyboard controller IC 54 on the SMBus 62. Upon detecting transmission of a SMBus message to the keyboard controller IC 54 via the SMBus 62, the bus-snooper circuit 124 stores a copy of the data portion of such message into a SMBus data register 124b independent of the power-management routine computer program executed by the CPU included in the CPU and memory 32. Storage of the data portion of a SMBus message into the SMBus data register 124b permits the bus-snooper circuit 124 to analyze such data for critical power-management events. The bus-snooper circuit 124 also includes a 22 bit counter for a 500 kilohertz clock signal that is used by the selector controller 82 as a timer 124c, as described in greater detail below, in determining whether the smart battery 22a or 22b is transmitting timely messages.

The registers 122 and the bus-snooper circuit 124 are coupled respectively by a register bus 126 and by a snooper bus 128 to an event-driven state machine 132 that is included in the selector controller 82.

A signal processing circuit 134, also included in the selector controller 82, receives analog signals from the battery-voltage input-terminals 78a and 78b and the AC-power-sensing input 79 of the smart selector 24. In response to these various analog signals, the signal processing circuit 134 transmits digital signals indicating the current state of the smart batteries 22a and 22b and of the AC-DC converter 71 to the state machine 132 via a processed-signal bus 136. Furthermore, each of the battery-voltage input-terminals 78a and 78b and the AC-power-sensing input 79 respectively connects to an anode of a diode 138. Cathodes of the diodes 138 connect together in common for supplying electrical power to the selector controller 82 regardless of which of the three power sources, i.e. the smart battery 22a or 22b or the AC-DC converter 71, may be at any instant present in the computer system 20'. If the computer system 20 includes the conventional charger 108, the signal processing circuit 134 also receives battery charging-rate signals from the fast-charging-rate signal-line 112 and the fast-charging-rate signal-line 114 and supplies them to the state machine 132.

An output signal from the state machine 132 included in the selector controller 82 is coupled to a SMBus alert signal-line 142 included in the SMBus 62. Transmission of a signal from the selector controller 82 via the SMBus alert signal-line 142 alerts the power-management routine computer program executed by the CPU included in the CPU and memory 32 that some type of event requiring processing by the power-management routine has occurred in, or been detected by, the selector controller 82.

The state machine 132 also transmits other output signals via a switch-drivers-signals bus 144 to a set of seven switch drivers 146a–146g. The switch drivers 146a–146c, which constitute a set of operating-power-switch drivers, supply the power-switch control-signals 92 to the operating-power switches 64a, 64b and 64c. Each of the switch drivers 146a–146c is associated respectively with a particular smart battery 22a or 22b, or with the external power source provided by the AC-DC converter 71. The switch drivers 146a–146c provide signals for effecting a selection of the associated smart battery 22a or 22b or the AC-DC converter 71 for providing electrical power to energize operation of the computer system 20.

At any instant, the switch drivers 146a–146c selects either one of the smart batteries 22a or 22b or the AC-DC converter 71 to provide electrical power for energizing the operation of the computer system 20. The state machine 132 ensures that only one of the smart batteries 22a or 22b or the AC-DC converter 71 is coupled to the main power-bus 66 at any instant in time thereby preventing damage to the smart battery 22a or 22b or to the AC-DC converter 71. If a failure of the selector controller 82 should cause the signals being transmitted to the switch drivers 146a–146c to concurrently specify activation of more than one of switch drivers 146a–146c, then the state machine 132 transmits signals to the switch drivers 146a–146c that deactivate all of them.

The battery-recharge control-signals 94 signals from the switch drivers 146d and 146e control operation of the battery-recharge switches 76a and 76b. Accordingly, the switch drivers 146d and 146e constitute battery-recharge-switch drivers that are respectively associated with a particular smart battery 22a or 22b. The switch drivers 146d and 146e provide control signals to the battery-recharge switches 76a and 76b to effect, at any instant, a coupling of only one of the smart batteries 22a or 22b to the output terminal 75 of the smart-battery charger 26 or of the charger 108.

Finally, as indicated by the dashed line 88, control signals from the switch drivers 146f and 146g determine which smart battery 22a or 22b may exchange SMBus messages via the SMBus 62 with the smart-battery charger 26, if present in the computer system 20, or with the keyboard controller IC 54. Coupling of one of the smart batteries 22a or 22b to the SMBus 62 via the SMBus selector-switch 84 permits the smart battery 22a or 22b to transmit SMBus messages to the power-management routine computer program in accordance with the "*Smart Battery Data Specification Revision* 1.0."Such SMBus messages may report an electrical model for the particular smart battery 22a or 22b, a remaining capacity alarm, a remaining time alarm, an overcharge alarm, or a battery status message for the smart battery 22a or 22b.

To facilitate communication between the selector controller 82 and the power-management routine computer program executed by the CPU included in the CPU and memory 32, the selector state register 122a includes four (4) four (4) bit nibbles 122aa through 122ad that may be directly accessed by the state machine 132. A SMBus nibble 122aa, that may be both read and written by the power-management routine, stores data that controls which smart battery 22a or 22b the SMBus selector-switch 84 connects to the SMBus 62. A POWER_BY nibble 122ab, that may be both read and written by the power-management routine, stores data that controls which of the power sources, i.e. the smart battery 22a or 22b or the AC-DC converter 71, energizes operation of the computer system 20. A CHARGE nibble 122ac, that may be both read and written by the power-management routine, stores data that controls which smart battery 22a or 22b is being charged from the smart-battery charger 26. A PRESENT nibble 122ad, that may be only read by the power-management routine, stores data that indicates which power sources are present in the computer system 20.

The selector preset register 122b includes four (4) four (4) bit nibbles 122ba through 122bd that may be directly accessed by the state machine 132 or by the power-management routine computer program executed by the CPU included in the CPU and memory 32. The first two nibbles 122ba and 122bb store data bits, listed in the following table, that are written by the power-management routine for controlling the operation of the selector controller 82.

| Nibble | Bit | Data |
| --- | --- | --- |
| 122ba | 0 | Non-SMBus charger |
|  | 1 | (Unused) |
|  | 2 | (Unused) |
|  | 3 | Listen for battery charging messages |
| 122bb | 0 | Operating in Suspend mode |
|  | 1 | Listen for remaining capacity messages |
|  | 2 | Listen for overcharge messages |
|  | 3 | (Unused) |

A USE_NEXT nibble 122bc, that may be both read and written by the power-management routine, stores data that indicates which smart battery 22a or 22b should be used if for any reason the present power source should be removed or become discharged. An OK_TO_USE nibble 122bd, that may be both read and written by the power-management routine, stores data that indicates what power sources may be used for energizing operation of the computer system 20.

In accordance with the SMBus specification, the selector support register 122c stores various information about the selector controller 82 such as the number of batteries which the selector controller 82 supports, and the version of the SMBus specification with which the selector controller 82 complies. In addition to such standardized data, the preferred embodiment of the selector controller 82 also stores data in the selector support register 122c that indicates if a smart battery is being charged at a fast or at a slow rate by the conventional charger 108. In this way, if the computer system 20 lacks the smart-battery charger 26, the selector controller 82 permits a power-management routine computer program executed by the CPU included in the CPU and memory 32 to retrieve such battery charging-rate data from the selector controller 82.

As indicated above, the selector preset register 122*b* receives and stores operating mode data from the power-management routine computer program for controlling the response of the selector controller 82 to the bus-snooper circuit 124. In a first state, such operating mode activates response to the bus-snooper circuit 124, and in a second state deactivates response to the bus-snooper circuit 124. In the preferred embodiment, as explained in greater detail below, the bus-snooper circuit 124 may be activated to autonomously respond to a low battery-capacity SMBus message transmitted on the SMBus 62 by the smart battery 22*a* or 22*b*, or to an overcharge battery-condition SMBus message from the smart battery 22*a* or 22*b*. Thus, the CPU included in the CPU and memory 32 may more safely enter a "Suspend" operating mode in which the CPU consumes a lesser amount of electrical power because certain portions of the CPU are turned-off. When operating in the "Suspend" mode, the CPU cannot respond to SMBus messages from the smart battery 22*a* or 22*b*. Thus, without the bus-snooper circuit 124 if the smart battery 22*a* or 22*b* energizing operation of the computer system 20 were to issue a low battery-capacity SMBus message, the message would be ignored by the power-management routine. However, with the selector controller 82 activated to respond to detection of a low battery-capacity SMBus message by the bus-snooper circuit 124, the selector controller 82 can autonomously respond to that message by switching to another well charged smart battery 22*a* or 22*b* if such is available within the computer system 20. In the preferred embodiment, if the bus-snooper circuit 124 detects an overcharge battery-condition SMBus message the selector controller 82 provides similar autonomous battery switching. When the CPU terminates operating in the "Suspend" mode, the power-management routine may deactivate detection of such SMBus messages by the bus-snooper circuit 124 thereby restoring full control over power management to the power management routine.

Power-Up Reset

Figure 4A:
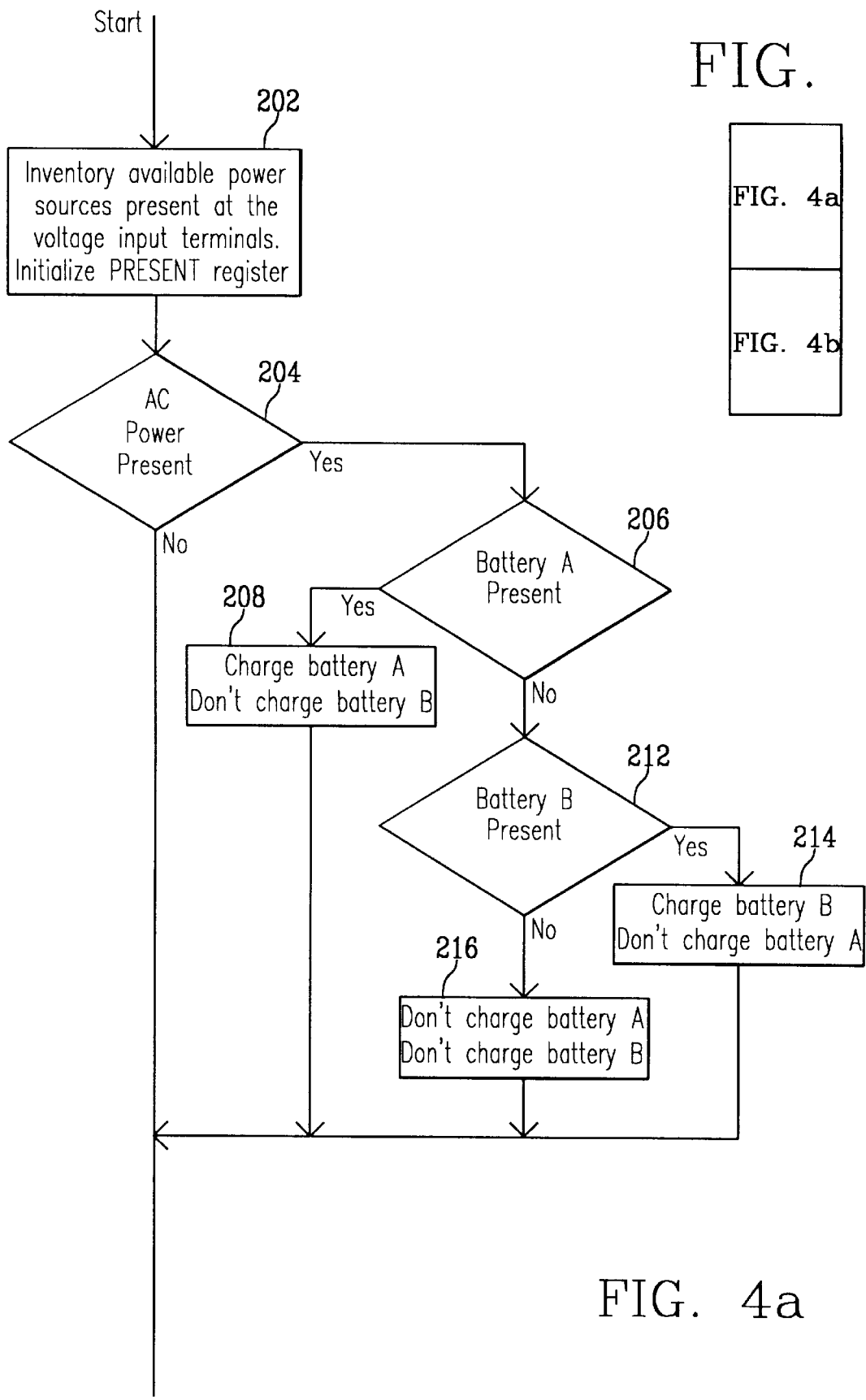
FIG. 4 depicts the relationship between FIGS. 4a and 4b, the combined FIGS. 4a and 4b forming a decisional flow chart for operation of an event-driven state machine included in the selector controller immediately following a power-up reset of the digital computer system.
Figure 4B:
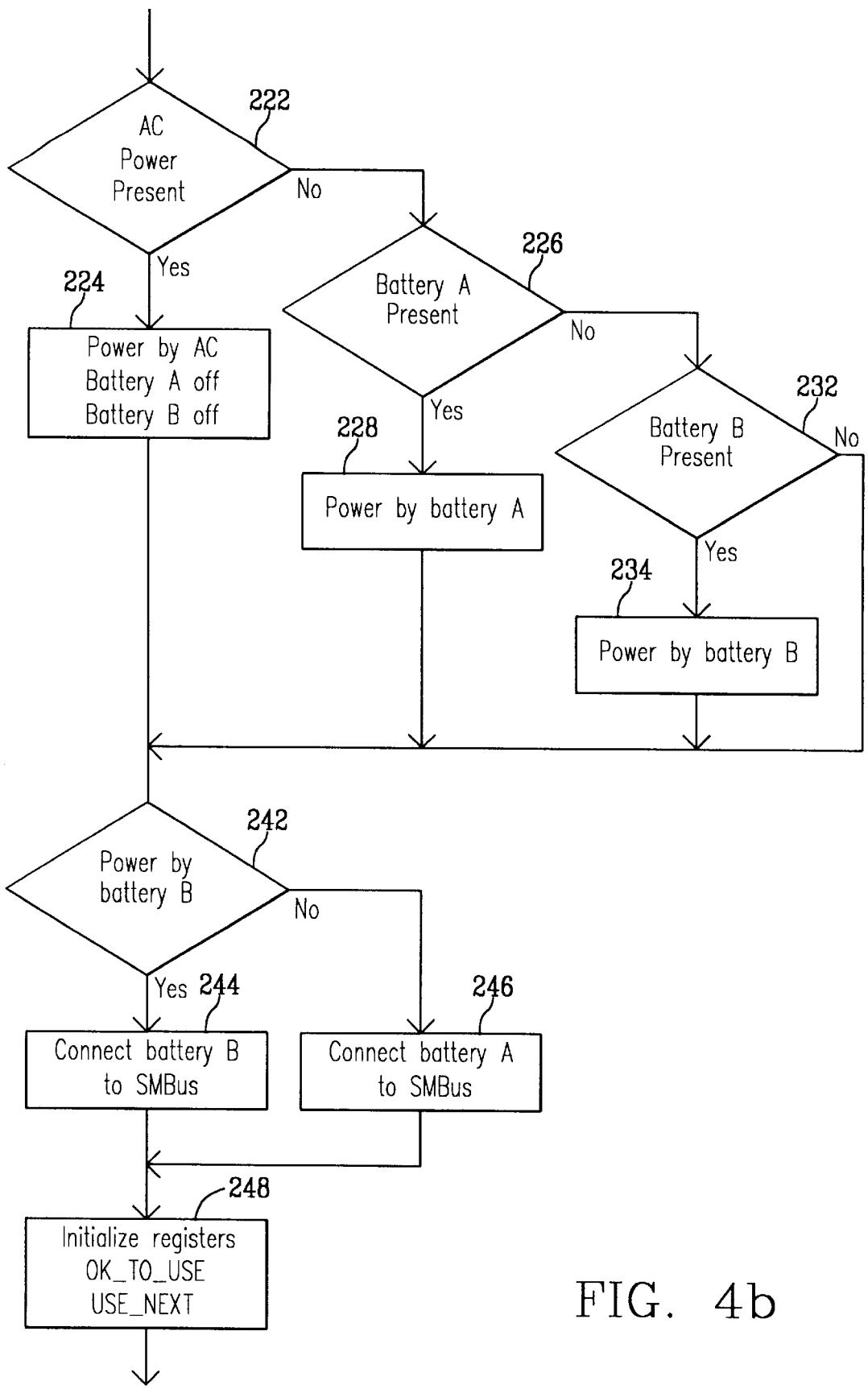

FIGS. 4*a* and 4*b*, when juxtaposed as illustrated in FIG. 4, form a decisional flow chart illustrating operation of the event-driven state machine 132 included in the selector controller 82 immediately following a power-up reset of the computer system 20. Immediately after a power-up reset, the selector controller 82, in processing block 202 on FIG. 4*a*, inventories the power sources by determining if the voltage present at the battery-voltage input-terminals 78*a* and 78*b* and the AC-power-sensing input 79 exceed a pre-established lower threshold, e.g. 1.0 volts for a NiMH battery or 11.0 volts for the AC-DC converter 71. If the voltages present at the battery-voltage input-terminals 78*a* and 78*b* and the AC-power-sensing input 79 respectively exceed the lower threshold, then bits are set in the PRESENT nibble 122*ad* to indicate that the power source associated with each such bit is present in the computer system 20. The state machine 132, in decision block 204, then tests data in the PRESENT nibble 122*ad* to determine if power is available from the AC-DC converter 71. If power is available from the AC-DC converter 71, then the state machine 132, in decision block 206, tests data present in the PRESENT nibble 122*ad* to determine if smart battery 22*a* is present in the computer system 20. If the smart battery 22*a* is present in the computer system 20, the state machine 132, in processing block 208, then stores data into the CHARGE nibble 122*ac* which causes charging of smart battery 22*a* and prevents charging of smart battery 22*b*. If the smart battery 22*a* is not present in the computer system 20, then the state machine 132, in decision block 212, tests the data present in the PRESENT nibble 122*ad* to determine if smart battery 22*b* is present in the computer system 20. If the smart battery 22*b* is present in the computer system 20, the state machine 132, in processing block 214, then stores data into the CHARGE nibble 122*ac* which causes charging of smart battery 22*b* and prevents charging of smart battery 22*a*. If the smart battery 22*b* is not present in the computer system 20, the state machine 132, in processing block 216, then stores data into the CHARGE nibble 122*ac* which prevents charging of both smart batteries 22*a* and 22*b*.

The state machine 132, in decision block 222, tests data in the PRESENT nibble 122*ad* to again determine if power is available from the AC-DC converter 71. If power is available from the AC-DC converter 71, the state machine 132, in processing block 224, then stores data into the POWER_BY nibble 122*ab* which causes power from only the AC-DC converter 71 to energize operation of the computer system 20. If power is not available from the AC-DC converter 71, then the state machine 132, in decision block 226, tests data present in the PRESENT nibble 122*ad* to determine if smart battery 22*a* is present in the computer system 20. If the smart battery 22*a* is present in the computer system 20, the state machine 132, in processing block 228, then stores data into the POWER_BY nibble 122*ab* which causes power from only smart battery 22*a* to energize operation of the computer system 20. If the smart battery 22*a* is not present in the computer system 20, then the state machine 132, in decision block 232, tests the data present in the PRESENT nibble 122*ad* to determine if smart battery 22*b* is present in the computer system 20. If the smart battery 22*b* is present in the computer system 20, the state machine 132, in processing block 234, then stores data into the POWER_BY nibble 122*ab* which causes power from only smart battery 22*b* to energize operation of the computer system 20. Since either smart battery 22*a* or 22*b* or the AC-DC converter 71 must be present in the computer system 20 to energize operation of the selector controller 82, the selector controller 82 must select one of these three power sources to energize operation of the computer system 20.

Regardless of which power source energizes operation the computer system 20, the state machine 132, in decision block 242, tests data present in the POWER_BY nibble 122*ab* to determine if smart battery 22*b* is supplying power for energizing operation of the computer system 20. If smart battery 22*b* is supplying power for energizing operation of the computer system 20, then the state machine 132, in processing block 244, stores data into the SMBus nibble 122*aa* which effects a connection of the smart battery 22*b* to the SMBus 62 via the SMBus selector-switch 84. If smart battery 22*b* is not supplying power for energizing operation of the computer system 20, then the state machine 132, in processing block 246, stores data into the SMBus nibble 122*aa* which effects a connection of the smart battery 22*a* to the SMBus 62. Finally in processing block 248 the state machine 132 initializes the OK_TO_USE nibble 122*bd* to indicate which of the smart batteries 22*a* or 22*b* are available for use, and sets the USE_NEXT nibble 122*bc* to zero to indicate no preference for which smart battery 22*a* or 22*b* is to be used next for energizing operation of the computer system 20. After completing this final operation of the power-up reset process, the state machine 132 enters a wait state awaiting another event affecting the smart batteries 22*a* or 22*b* or the AC-DC converter 71.

Changing Power Source

Figures 5, 10B:
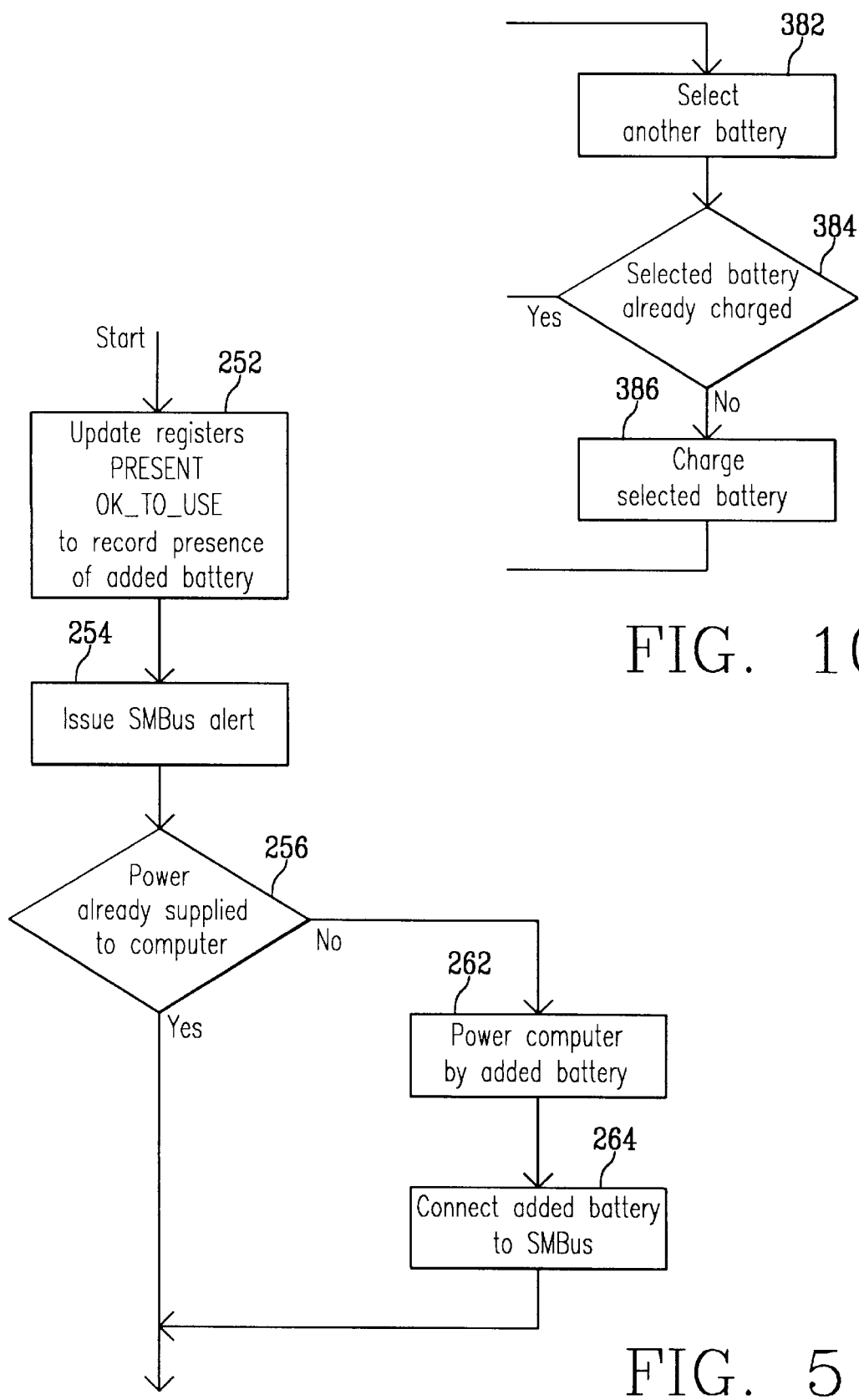
FIG. 5 is a decisional flow chart for operation of the event-driven state machine included in the selector controller immediately following addition of a battery to the digital computer system.

The decisional flow chart of FIG. 5 depicts operation of the event-driven state machine 132 immediately after one of the smart batteries 22*a* or 22*b* has been added to the computer system 20. Upon addition of one of the smart batteries 22*a* or 22*b*, the state machine 132, in processing block 252, updates the PRESENT nibble 122*ad* and the OK_TO_USE nibble 122*bd* to record the battery's addition to the computer system 20. Then, in processing block 254, the state machine 132 issues a SMBus alert via the SMBus alert signal-line 142 so the power-management routine computer program executed by the CPU included in the CPU and memory 32 will be activated to record the battery's presence. After issuing the SMBus alert, the state machine 132, in decisional block 256, checks the POWER_BY nibble 122*ab* to determine if power is already being supplied to energize operation of the computer system 20. If the computer system 20 is already being energized, then the state machine 132 re-enters the wait state awaiting another event affecting the smart batteries 22*a* or 22*b* or the AC-DC converter 71. If the computer system 20 is not already being energized, the state machine 132, in processing block 262, then stores data into the POWER_BY nibble 122*ab* which causes power from the added battery to energize operation of the computer system 20. Subsequently, in processing block 264, the state machine 132 stores data into the SMBus nibble 122*aa* which effects a connection of the added battery to the SMBus 62 via the SMBus selector-switch 84. After connecting the added battery to the SMBus 62, the state machine 132 re-enters the wait state awaiting another event affecting the smart batteries 22*a* or 22*b* or the AC-DC converter 71.

Figure 6A:
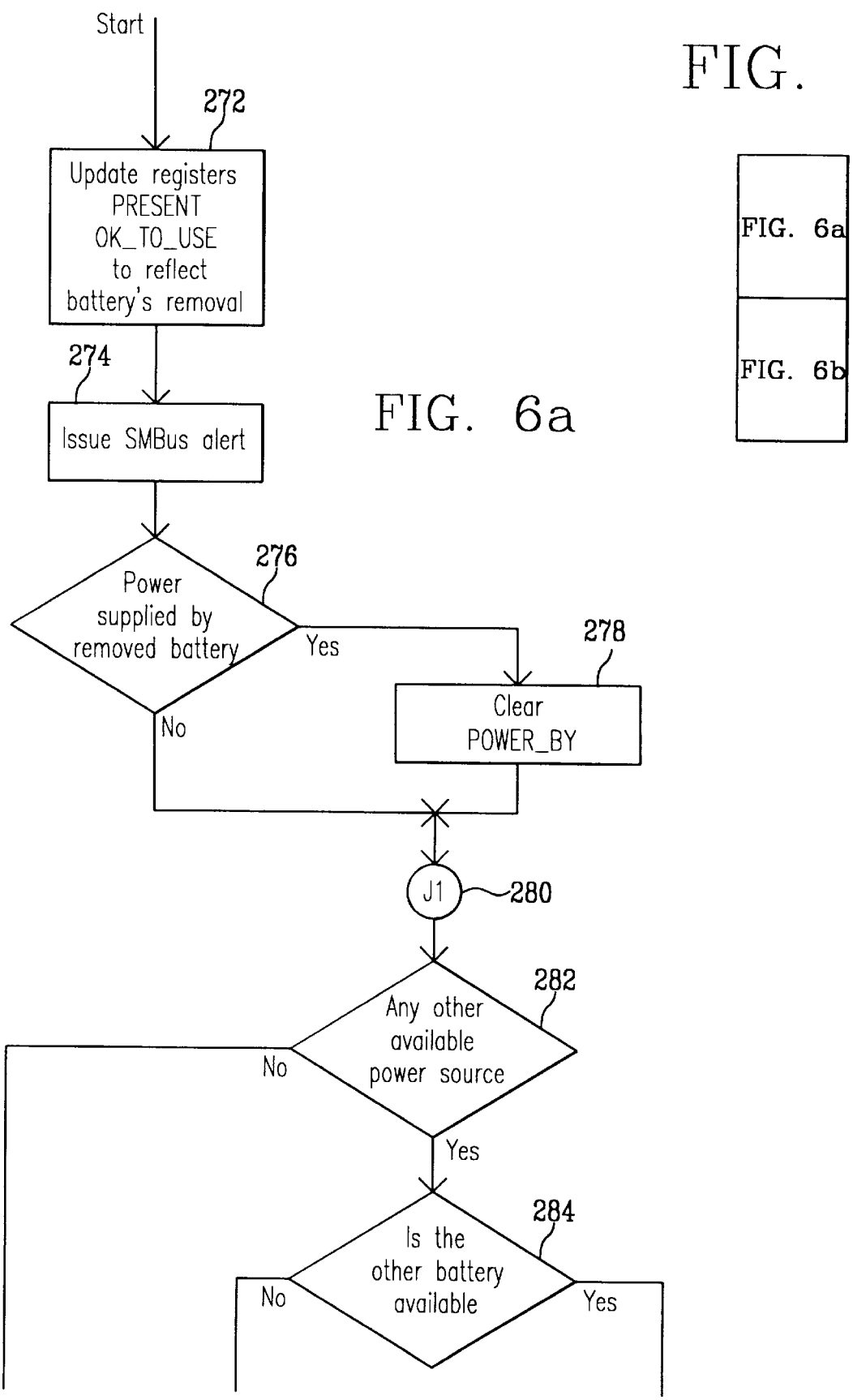
FIG. 6 depicts the relationship between FIGS. 6a and 6b, the combined FIGS. 6a and 6b forming a decisional flow chart for operation of the event-driven state machine included in the selector controller immediately following removal of a battery from the digital computer system.
Figure 6B:
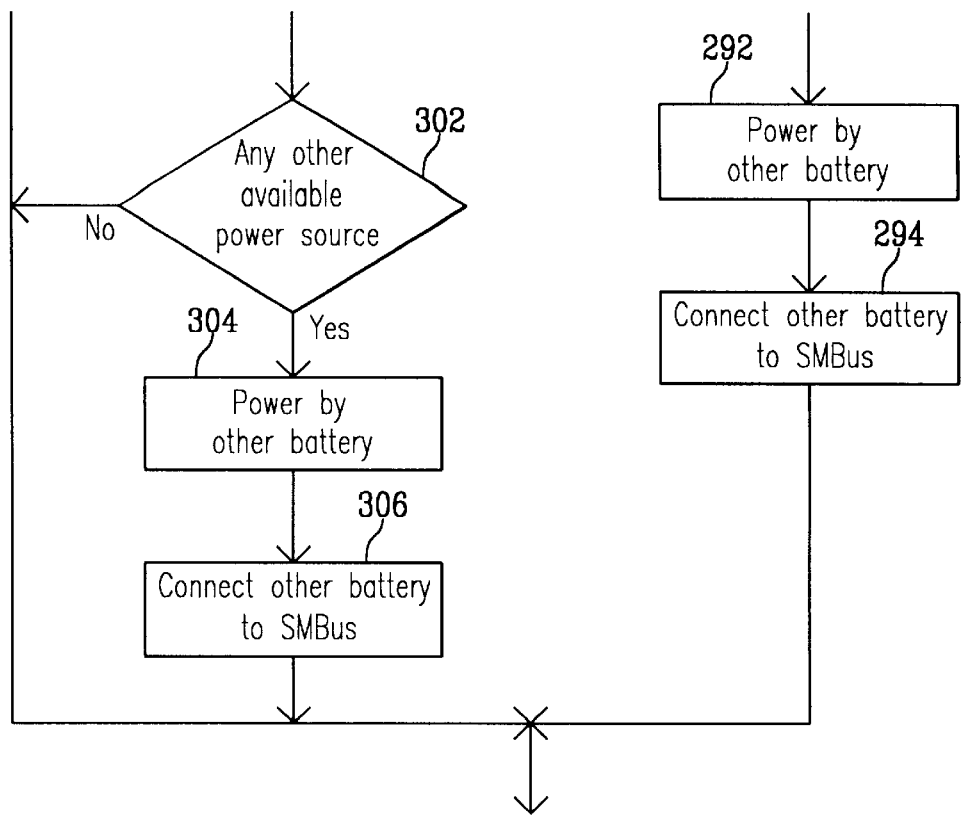

FIGS. 6*a* and 6*b,* when juxtaposed as illustrated in FIG. 6, form a decisional flow chart for operation of the state machine 132 immediately following removal of a smart battery 22*a* or 22*b* from the computer system 20. Immediately following removal of a smart battery 22*a* or 22*b*, in processing block 272, the PRESENT nibble 122*ad* and the OK_TO_USE nibble 122*bd* are updated to reflect removal of the smart battery 22*a* or 22*b*. Then, in processing block 274, the state machine 132 issues a SMBus alert via the SMBus alert signal-line 142 so the power-management routine computer program executed by the CPU included in the CPU and memory 32 will be activated to record the battery's removal. Immediately thereafter, the state machine 132, in decision block 276, interrogates the POWER_BY nibble 122*ab* to determine if the removed smart battery 22*a* or 22*b* was energizing operation of the computer system 20. If the removed smart battery 22*a* or 22*b* was energizing operation of the computer system 20, then in processing block 278, the state machine 132 clears the POWER_BY nibble 122*ab* to indicate that no power source is presently assigned for energizing operation of the computer system 20. Regardless of whether the removed smart battery 22*a* or 22*b* was energizing operation of the computer system 20, operation of the state machine 132 then passes through entry point J1 280.

Following entry point J1 280, the state machine 132, in decision block 282, interrogates the USE_NEXT nibble 122*bc* to determine if there are any other power sources available to energize operation of the computer system 20. If there are no other available power sources, the state machine 132 re-enters the wait state awaiting another event affecting the smart batteries 22*a* or 22*b* or the AC-DC converter 71. If there are other available power sources, the state machine 132, in decision block 284, determines if another battery, that exceeds a pre-established first threshold, e.g. 1.0 volts, is available. If another battery exceeding the first threshold is available to energize operation of the computer system 20, then, in processing block 292, the state machine 132 stores data into the POWER_BY nibble 122*ab* which causes power from only that battery to energize operation of the computer system 20. Subsequently, in processing block 294 the state machine 132 stores data into the SMBus nibble 122*aa* which effects a connection to the SMBus 62 via the SMBus selector-switch 84 of the smart battery 22*a* or 22*b* which has just been selected to energize operation of the computer system 20. The state machine 132 then re-enters the wait state awaiting another event affecting the smart batteries 22*a* or 22*b* or the AC-DC converter 71.

If other batteries do not exceed the first threshold, then the state machine 132, in decision block 302, determines if another battery whose voltage equals or exceeds 1.0 volts is available to energize operation of the computer system 20. If another battery equaling or exceeding 1.0 volts is available, then in-processing block 304 the state machine 132 stores data into the POWER_BY nibble 122*ab* which causes power from only that battery to energize operation of the computer system 20. Subsequently, in processing block 306 the state machine 132 stores data into the SMBus nibble 122*aa* which effects a connection to the SMBus 62 via the SMBus selector-switch 84 of the smart battery 22*a* or 22*b* which has just been selected to energize operation of the computer system 20. The state machine 132 then re-enters the wait state awaiting another event affecting the smart batteries 22*a* or 22*b* or the AC-DC converter 71.

FIG. 7 is a flow chart illustrating operation of the event-driven state machine 132 included in the selector controller 82 immediately after connecting an external power source such as the AC-DC converter 71 to the computer system 20. Upon connection of the AC-DC converter 71 to the computer system 20, the state machine 132, in processing block 322, immediately issues a SMBus alert via the SMBus alert signal-line 142 so the power-management routine computer program executed by the CPU included in the CPU and memory 32 will be activated to record the power source's connection. The state machine 132, in decision block 324, then determines from the voltages present at the battery-voltage input-terminals 78*a* and 78*b* and the AC-power-sensing input 79 if the AC-DC converter 71 is supplying power to the computer system 20. If the AC-DC converter 71 is supplying power to the computer system 20, the state machine 132 in processing block 326 then stores data into the POWER_BY nibble 122*ab* that causes power from only the AC-DC converter 71 to energize operation of the computer system 20 and turns off smart battery 22*b*, and also stores data into the that CHARGE nibble 122*ac* that activates charging of smart battery 22*a*. The state machine 132 then re-enters the wait state awaiting another event affecting the smart batteries 22*a* or 22*b* or the AC-DC converter 71. If the power-management routine computer program executed by the CPU included in the CPU and memory 32 in responding to the SMBus alert determines that smart battery 22*b* rather than smart battery 22*a* should be recharged, data transmitted to the registers 122 included in the selector controller 82 from the CPU via the SMBus 62 subsequently causes the selector controller 82 to effect such a change.

Figure 8:
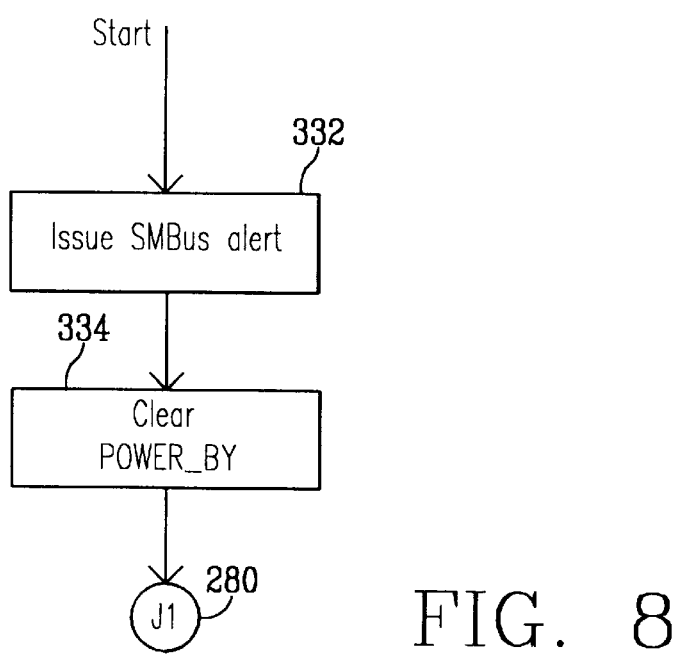
FIG. 8 is a decisional flow chart for operation of the event-driven state machine included in the selector controller immediately following disconnection of AC-DC converter from the digital computer system.

FIG. 8 is a flow chart illustrating operation of the event-driven state machine 132 included in the selector controller 82 immediately after disconnection of AC-DC converter 71 from the computer system 20. Upon disconnection of the AC-DC converter 71, the state machine 132, in processing block 332 immediately issues a SMBus alert via the SMBus alert signal-line 142 so the power-management routine computer program executed by the CPU included in the CPU and memory 32 will be activated to record the power sources disconnection. Then, in processing block 334, the state machine 132 stores data into the POWER_BY nibble 122ab which indicates that no power source is energizing the operation of the computer system 20. The state machine 132 then jumps to the entry point J1 280 in FIG. 6a in an attempt to locate an alternative power source by executing the procedure specified by the processing blocks in FIGS. 6a and 6b that follow the entry point J1 280.

Figure 9:
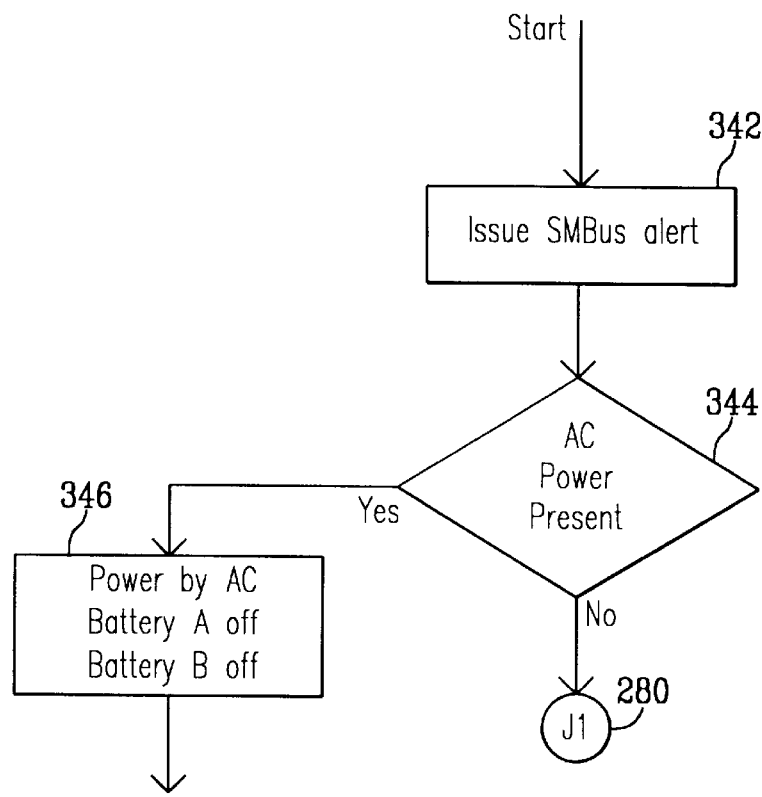
FIG. 9 is a decisional flow chart for operation of the event-driven state machine included in the selector controller immediately following autonomous battery power switching.

FIG. 9 is a decisional flow chart illustrating operation of the event-driven state machine 132 included in the selector controller 82 immediately following autonomous battery-power switching. Upon the occurrence of an autonomous battery-power switch, the state machine 132, in processing block 342, issues a SMBus alert via the SMBus alert signal-line 142 so the power-management routine computer program executed by the CPU included in the CPU and memory 32 will be activated to record the autonomous battery-power switching event. The state machine 132, in decision block 344, then tests data present in the PRESENT nibble 122ad to determine if power is available from the AC-DC converter 71. If power is available from the AC-DC converter 71, then the state machine 132, in processing block 346, stores data into the POWER_BY nibble 122ab that causes power from only the AC-DC converter 71 to energize operation of the computer system 20. If power is not available from the AC-DC converter 71, the state machine 132 then jumps to the entry point J1 280 in FIG. 6a in an attempt to locate an alternative power source by executing the procedure specified by the processing blocks in FIGS. 6a and 6b that follow the entry point J1 280.

While the preceding descriptions of Power-Up Reset and Changing Power Source have specified nominal threshold voltages necessary for effecting certain operating conditions, in the preferred embodiment of the present invention the threshold voltages may, in fact, be programmed to other values by resistors connected externally to the smart selector 24 or 24'.

Suspend Operating Mode

Figure 10E:
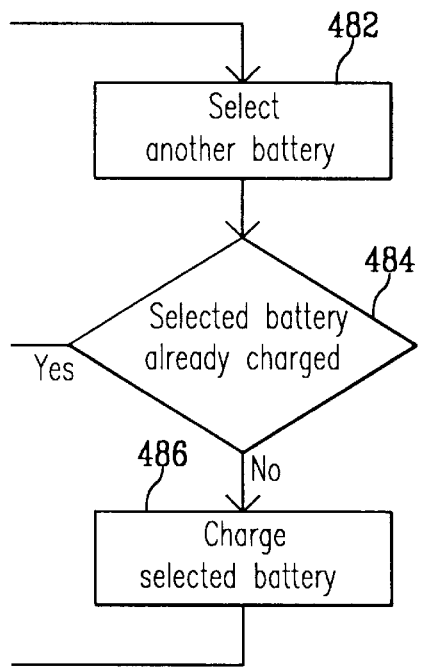
FIG. 10 depicts the relationship among FIGS. 10a–10e, the combined FIGS. 10a–10e forming a decisional flow chart for operation of the event-driven state machine included in the selector controller that is pertinent to operation of the digital computer system in the "Suspend" operating mode.
Figure 10C:
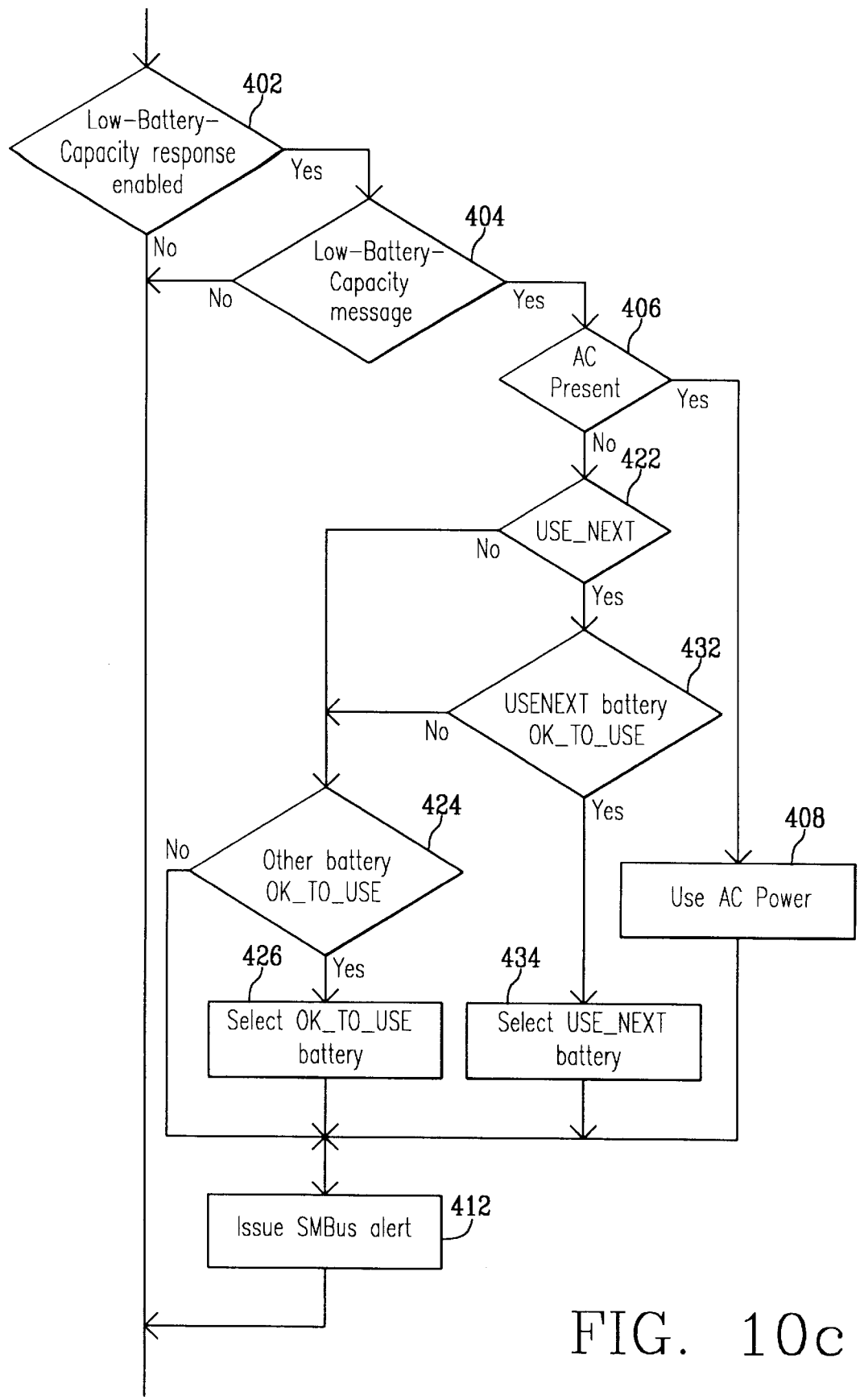

FIGS. 10a, 10b and 10c, when juxtaposed as illustrated in FIG. 10, form a decisional flow chart illustrating operation of the event-driven state machine 132 included in the selector controller 82 that is pertinent to operation of the computer system 20 in the "Suspend" operating mode. If the power-management routine computer program executed by the CPU included in the CPU and memory 32 prior to entering the "Suspend" operating mode sets appropriate bits in the selector preset register 122b, then that stored data permits the state machine 132 to respond autonomously to particular types of messages transmitted via the SMBus 62.

As illustrated by decision block 352 in FIGS. 10a, if a data bit stored into the selector preset register 122b activates the selector controller 82 to respond to battery overcharge messages from the smart battery 22a or 22b, then the state machine 132 in decision block 354 determines if the bus-snooper circuit 124 has received a SMBus overcharge message from the SMBus 62. If the selector controller 82 has not been activated for responding to battery overcharge messages or has not received a SMBus overcharge message from the SMBus 62, then the state machine 132 tests to determine if a response to a low-battery-capacity message has been enabled.

However, if in decision block 354 the bus-snooper circuit 124 has received a SMBus overcharge message from the SMBus 62, then the state machine 132 in decision block 356 determines if the computer system 20 includes the smart-battery charger 26 depicted in FIG. 1a. If the computer system 20 includes the smart-battery charger 26, then the state machine 132 in decision block 358 determines if another smart battery 22a or 22b is present in the computer system 20. If another smart battery 22a or 22b is present in the computer system 20, the state machine 132 in processing block 362 switches the smart-battery charger 26 to the other smart battery 22a or 22b. Regardless of whether another smart battery 22a or 22b is present in the computer system 20, the state machine 132 in processing block 364 places a SMBus alert message on the SMBus 62, and then tests to determine if a response to a battery overcharge message has been enabled.

If in decision block 356 the state machine 132 determined that the computer system 20 includes the conventional charger 108 depicted in FIG. 1b, then in decision block 372 the state machine 132 determines if another smart battery 22a or 22b is present in the computer system 20. If another smart battery 22a or 22b is not present in the computer system 20, the state machine 132 in processing block 374 causes the charger 108 to supply only a trickle charge to the sole smart battery 22a or 22b. After the state machine 132 causes the charger 108 to supply only a trickle charge to the sole smart battery 22a or 22b, the state machine 132 in processing block 364 places a SMBus alert message on the SMBus 62, and then tests to determine if a response to a battery overcharge message has been enabled.

If, however, in decision block 372 the state machine 132 determines that another smart battery 22a or 22b is present in the computer system 20, then in processing block 382 of FIG. 10b the state machine 132 selects the other smart battery 22a or 22b for charging. Having selected another smart battery 22a or 22b for charging, the state machine 132 in decision block 384 determines if the newly selected smart battery 22a or 22b is already charged. If the newly selected smart battery 22a or 22b is already charged, then the state machine 132 in processing block 374 of FIG. 10a commences trickle charging of the newly selected smart battery 22a or 22b with the charger 108. However, if the newly selected smart battery 22a or 22b is not already charged, then in state machine 132 in processing block 386 of FIG. 10b starts normal charging of the newly selected smart battery 22a or 22b with the charger 108. Regardless of whether the state machine 132 causes the charger 108 to supply either a trickle charge or a normal charge to the newly selected smart battery 22a or 22b, the state machine 132 in processing block 364 of FIG. 10a places a SMBus alert message on the SMBus 62, and then tests to determine if a response to a battery overcharge message has been enabled.

Referring now to FIG. 10c, if the power-management routine computer program executed by the CPU included in the CPU and memory 32 prior to entering the "Suspend" operating mode sets the appropriate bit in the selector preset register 122b, then that stored data permits the state machine 132 to respond autonomously to low-battery-capacity messages transmitted via the SMBus 62. As illustrated by decision block 402 in FIGS. 10c, if data stored into the selector preset register 122b activates the selector controller 82 to respond to low-battery-capacity messages from the smart battery 22a or 22b, then the state machine 132 in decision block 404 determines if the bus-snooper circuit 124 has received a SMBus low-battery-capacity message from the SMBus 62. If the selector controller 82 has not been activated for responding to low-battery-capacity messages or has not received a SMBus low-battery-capacity message from the SMBus 62, then the state machine 132 tests to determine if listening for battery messages from the smart battery 22a or 22b has been enabled.

However, if in decision block 404 the bus-snooper circuit 124 has received a SMBus low-battery-capacity message from the SMBus 62, then the state machine 132 in decision block 406 determines if AC power is being supplied to the computer system 20. If AC power is being supplied to the computer system 20, then the state machine 132 in processing block 408 switches the computer system 20 to operating on AC power. After switching the computer system 20 to operating on AC power, the state machine 132 in processing block 412 places a SMBus alert message on the SMBus 62, and then tests to determine if the selector controller 82 is enabled for listening to battery messages.

If in decision block 406 the state machine 132 determines that AC power is not being supplied to the computer system 20, then the state machine 132 in decision block 422 determines if data stored into the USE_NEXT nibble 122bc specifies which of the smart battery 22a or 22b is to be used next. If data stored into the USE_NEXT nibble 122bc does not specify which smart battery 22a or 22b is to be used next, then in decision block 424 the state machine 132 determines if data present in OK_TO_USE nibble 122bd specifies another smart battery 22a or 22b that is O'K-to-use. If data present in the OK_TO_USE nibble 122bd fails to specify another smart battery 22a or 22b that is O'K-to-use, the state machine 132 in processing block 412 places a SMBus alert message on the SMBus 62, and then tests to determine if the selector controller 82 is enabled for listening to battery messages. If, however, data present in the OK_TO_USE nibble 122bd specifies another smart battery 22a or 22b that is O'K-to-use, then the state machine 132 in processing block 426 selects that smart battery 22a or 22b for supplying power for operating the computer system 20. After selecting the O'K-to-use smart battery 22a or 22b for supplying power for operating the computer system 20, the state machine 132 in processing block 412 places a SMBus alert message on the SMBus 62, and then tests to determine if the selector controller 82 is enabled for listening to battery messages.

If data present in the USE_NEXT nibble 122bc specifies which smart battery 22a or 22b-to-use next, then in decision block 432 the state machine 132 determines if data present in OK_TO_USE nibble 122bd specifies that the use-next smart battery 22a or 22b is O'K-to-use. If the use-next smart battery 22a or 22b is not O'K-to-use, then the state machine 132 in decision block 424 determines, in the way described previously, if there is any other smart battery 22a or 22b that is O'K-to-use. Conversely, if the use-next smart battery 22a or 22b is O'K-to-use, then the state machine 132 in processing block 434 selects the use-next smart battery 22a or 22b for supplying power for operating the computer system 20. After selecting the use-next smart battery 22a or 22b for supplying power for operating the computer system 20, the state machine 132 in processing block 412 places a SMBus alert message on the SMBus 62, and then tests to determine if the selector controller 82 is enabled for listening to battery messages.

Batteries that employ the NiMH chemistry loose a significant amount of capacity if recharged too frequently from a slightly discharged condition. To prevent loss of charge capacity, NiMH smart batteries stop transmitting SMBus messages to the SMBus 62 if charged above 80% of capacity. Consequently, if a first fully charged or almost fully charged NiMH smart battery were plugged into the computer system 20 while operating in the "Suspend" mode and were to be connected to the SMBus 62 by the smart selector 24, the bus-snooper circuit 124 receives no messages from that battery to which the selector controller 82 may respond.

If such an event were to occur, for example, while a second smart battery included in the computer system 20 needed charging, i.e. the second NiMH battery is charged to less than 80% of capacity, then the bus-snooper circuit 124 would receive no messages from the second smart battery because the smart selector 24, while connecting the first smart battery to the SMBus 62, isolates the second smart battery from the SMBus 62. Consequently, even though the second smart battery needs charging, the smart selector 24 will never begin charging the second smart battery while the computer system 20 remains in the "Suspend" operating mode. To avoid such a condition, the bus-snooper circuit 124 includes the timer 124c that the state machine 132 uses for switching between the smart batteries 22a and 22b if no battery condition messages appear on the SMBus 62 throughout a three (3) minute interval.

Figure 10D:
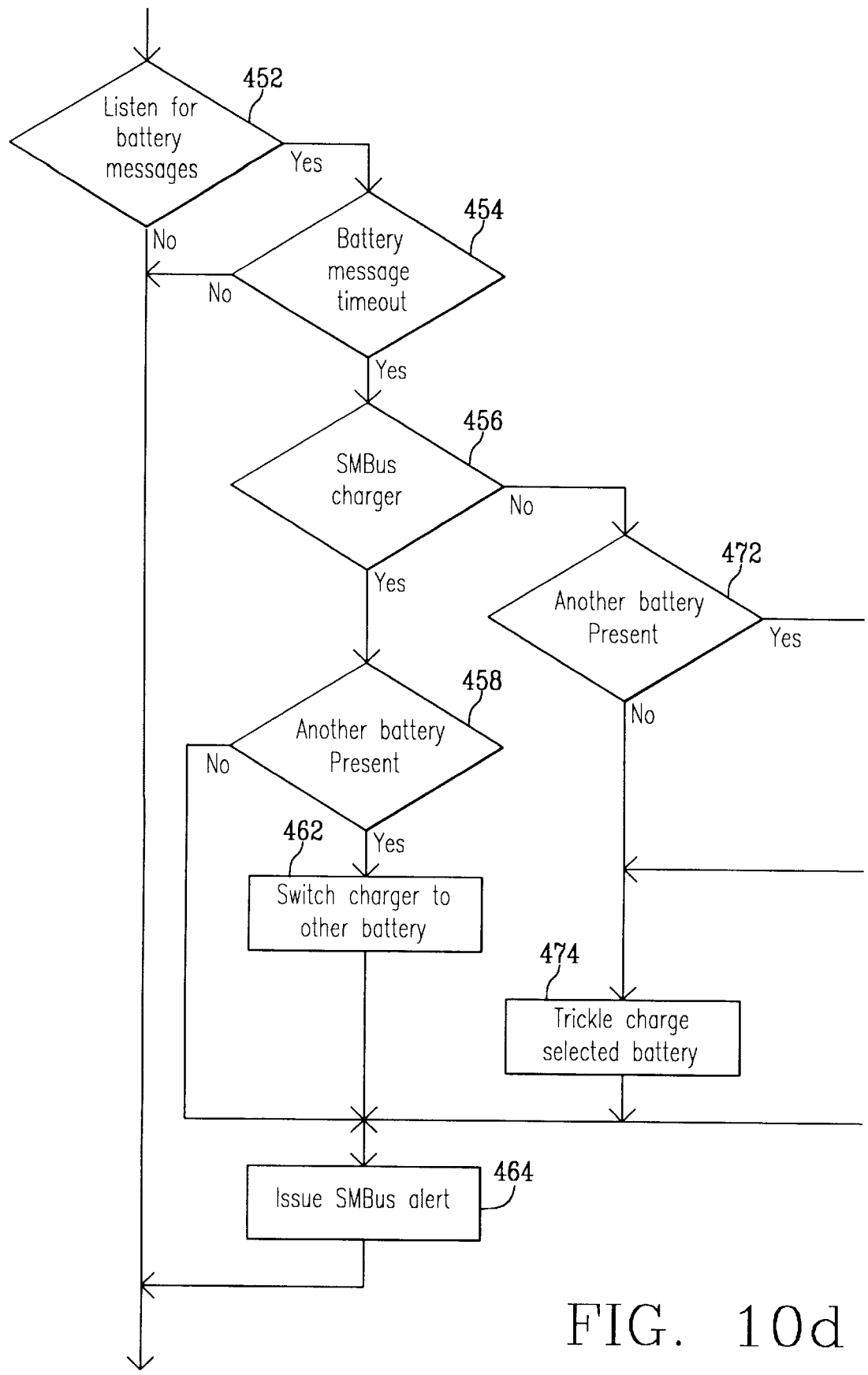

As illustrated by decision block 452 in FIGS. 10d, if a data bit stored into the selector preset register 122b activates the selector controller 82 for listening to battery messages from the smart battery 22a or 22b, then the state machine 132 in decision block 454 determines if a three minute time interval established by the timer 124c has elapsed without the smart battery 22a or 22b transmitting a battery message. If the selector controller 82 has not been activated to listen for battery messages or the three minute battery message interval established by the timer 124c has not expired, then the state machine 132 re-enters the wait state awaiting another event affecting the smart batteries 22a or 22b or the AC-DC converter 71.

However, if in decision block 454 the bus-snooper circuit 124 has not received a battery message during the three minute interval established by the timer 124c, then the state machine 132 in decision block 456 determines if the computer system 20 includes the smart-battery charger 26 depicted in FIG. 1a. If the computer system 20 includes the smart-battery charger 26, then the state machine 132 in decision block 458 determines if another smart battery 22a or 22b is present in the computer system 20. If another smart battery 22a or 22b is present in the computer system 20, the state machine 132 in processing block 462 switches the smart-battery charger 26 to the other smart battery 22a or 22b. Regardless of whether another smart battery 22a or 22b is present in the computer system 20, the state machine 132 in processing block 464 places a SMBus alert message on the SMBus 62, and then re-enters the wait state awaiting another event affecting the smart batteries 22a or 22b or the AC-DC converter 71.

If in decision block 456 the state machine 132 determined that the computer system 20 includes the conventional charger 108 depicted in FIG. 1b, then in decision block 472 the state machine 132 determines if another smart battery 22a or 22b is present in the computer system 20. If another smart battery 22a or 22b is not present in the computer system 20, the state machine 132 in processing block 474 causes the charger 108 to supply only a trickle charge to the sole smart battery 22a or 22b. After the state machine 132 causes the charger 108 to supply only a trickle charge to the sole smart battery 22a or 22b, the state machine 132 in processing block 464 places a SMBus alert message on the SMBus 62, and then re-enters the wait state awaiting another event affecting the smart batteries 22a or 22b or the AC-DC converter 71.

If, however, in decision block 472 the state machine 132 determines that another smart battery 22a or 22b is present in the computer system 20, then in processing block 482 of FIG. 10e the state machine 132 selects the other smart battery 22a or 22b for charging. Having selected another smart battery 22a or 22b for charging, the state machine 132 in decision block 484 determines if the newly selected smart battery 22a or 22b is already charged. If the newly selected smart battery 22a or 22b is already charged, then the state machine 132 in processing block 474 of FIG. 10d commences trickle charging of the newly selected smart battery 22a or 22b with the charger 108. However, if the newly selected smart battery 22a or 22b is not already charged, then in state machine 132 in processing block 486 of FIG. 10e starts normal charging of the newly selected smart battery 22a or 22b with the charger 108. Regardless of whether the state machine 132 causes the charger 108 to supply either a trickle charge or a normal charge to the newly selected smart battery 22a or 22b, the state machine 132 in processing block 464 of FIG. 10d places a SMBus alert message on the SMBus 62, and then re-enters the wait state awaiting another event affecting the smart batteries 22a or 22b or the AC-DC converter 71. In the preceding way, while the CPU included in the CPU and memory 32 of the computer system 20 operates in the "Suspend" operating mode, the selector controller 82, if appropriately enabled, responds autonomously either to overcharge SMBus messages, to low-battery-capacity SMBus messages, and/or to an absence of battery charging messages from the smart battery 22a or 22b for configuring electrical power supplied to the computer system 20.

Smart Battery Replacement with an AC-DC Converter

Figure 11A:
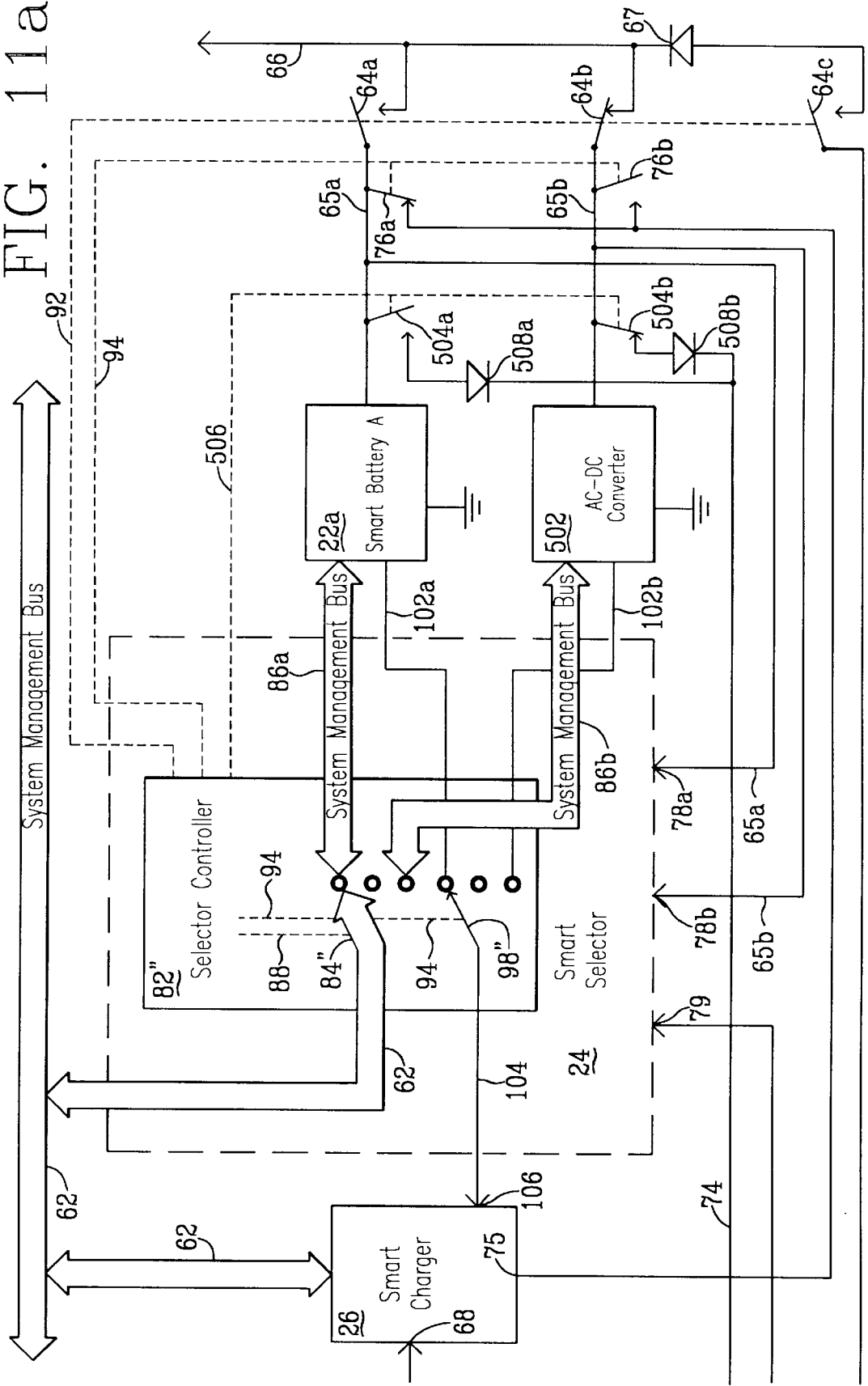
FIG. 11a is a block diagram of an alternative embodiment of the digital computer system depicted in FIG. 2a adapted for installing an AC-DC converter into a space normally occupied by one of the smart batteries.
Figure 11B:
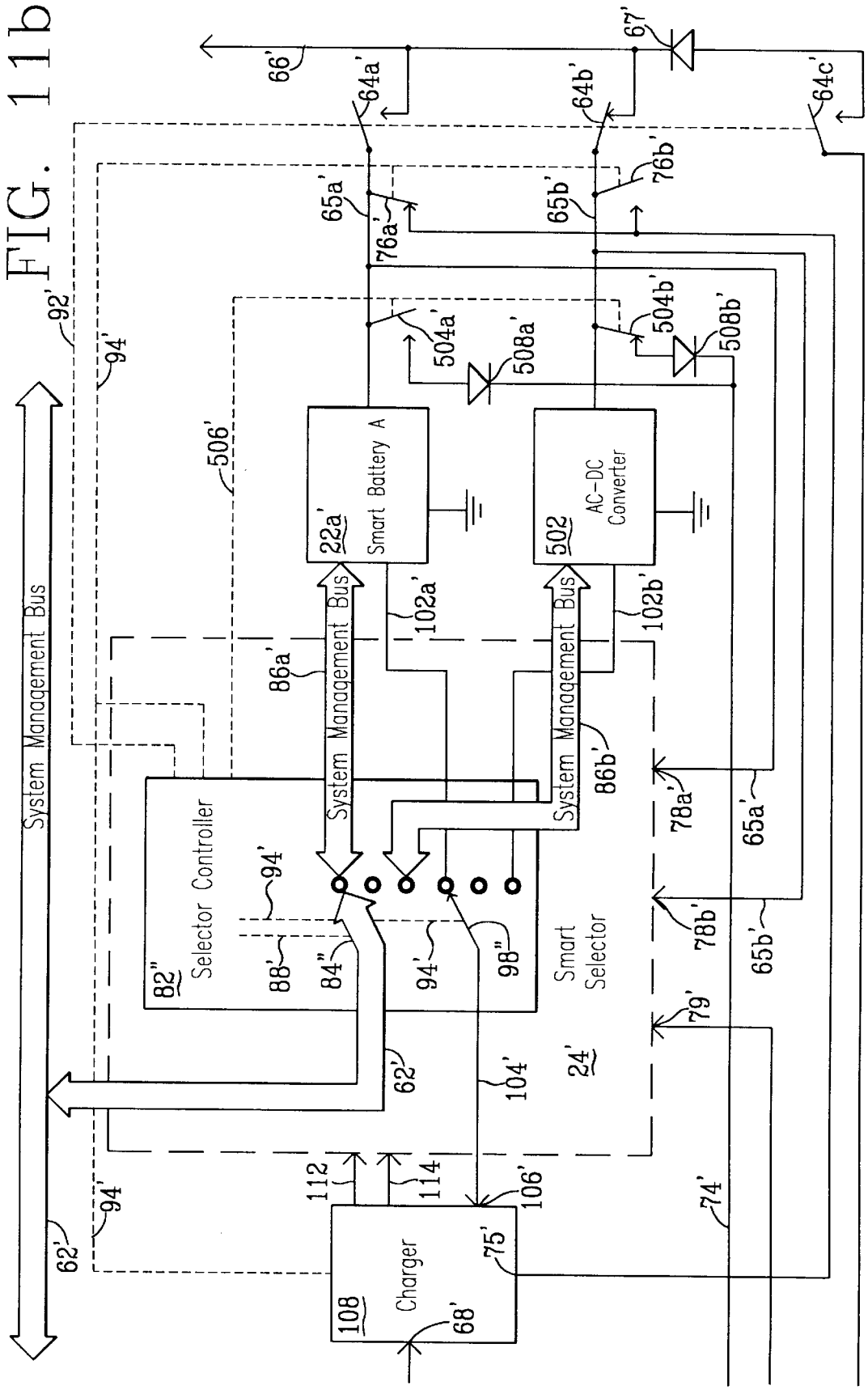
FIG. 11b is a block diagram of an alternative embodiment of the digital computer system depicted in FIG. 2b adapted for installing an AC-DC converter into a space normally occupied by one of the smart batteries.

FIGS. 11a and 11b depict alternative embodiments for that portion of the computer system 20 illustrated respectively in FIGS. 2a and 2b. In the illustration of FIGS. 11a and 11b, an alternative embodiment of the selector controller 82 or 82' respectively depicted in FIG. 2a or 2b incorporates into the selector controller 82 or 82' both the SMBus selector-switch 84 or 84' and the thermistor selector-switch 98 or 98'. Those elements depicted in FIGS. 11a and 11b that differ respectively from the corresponding element depicted in FIGS. 2a or 2b carry the same reference numeral distinguished by a double prime ("'") designation. Since the embodiment of the selector controller 82" depicted in FIGS. 11a and 11b includes both the SMBus selector-switch 84" and the thermistor selector-switch 98", the selector controller 82" is functionally equivalent to the entire smart selector 24 or 24" respectively depicted in FIGS. 2a and 2b.

Figure 12:
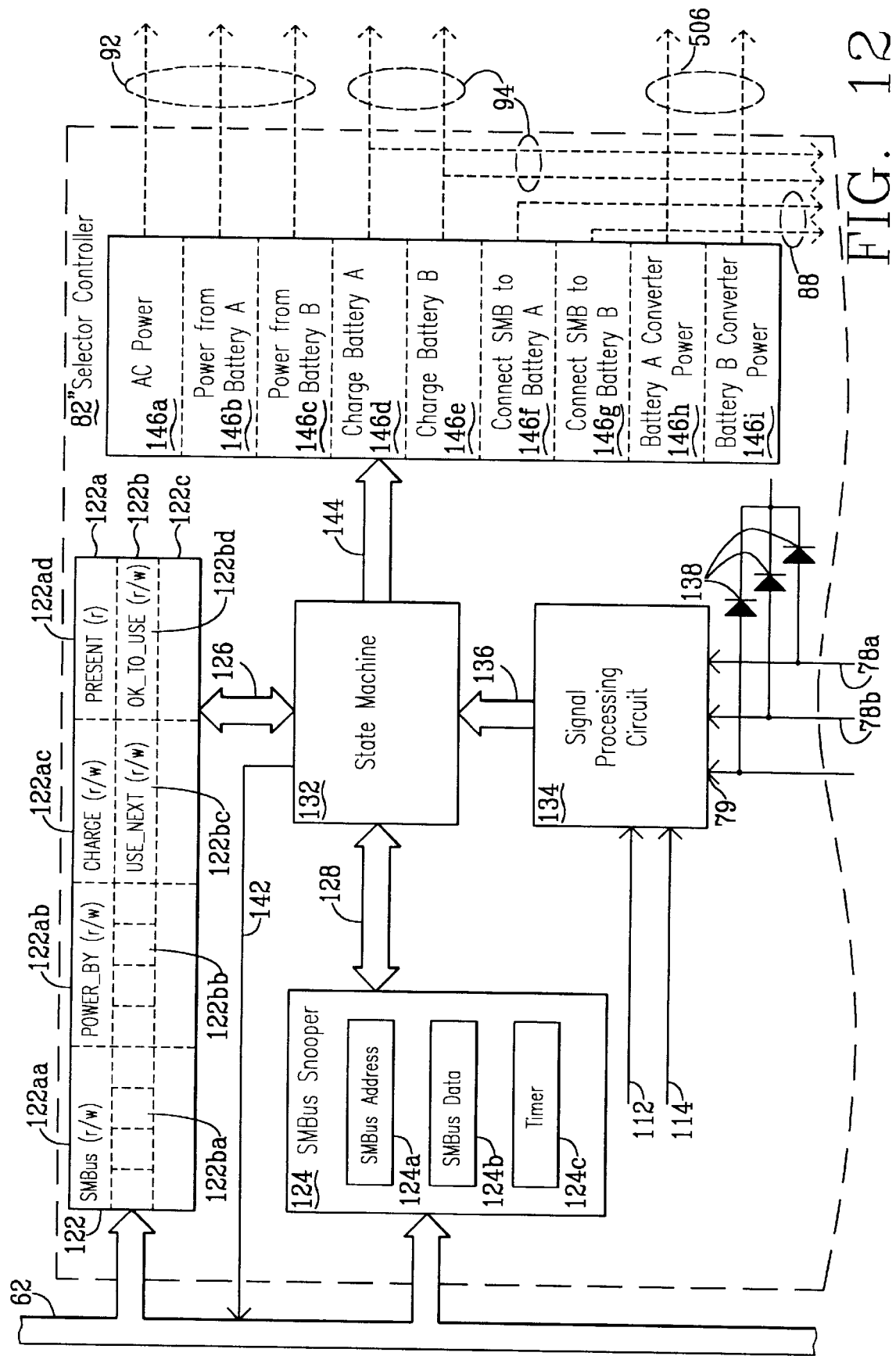
FIG. 12 is a block diagram depicting a portion of an alternative embodiment of the selector controller depicted in FIG. 3 that is adapted for the smart selectors respectively depicted in FIGS. 11a and 11b.

In the alternative embodiment depicted in FIGS. 11a and 11b, in addition to the alternative embodiment selector controller 82" a portion of which is depicted in FIG. 12, either one or the other of the smart batteries 22a or 22b is physically replaced with an AC-DC converter 502 that is functionally equivalent to the AC-DC converter 71 depicted in FIGS. 1a and 1b. That is, the AC-DC converter 502, when installed into the space normally occupied by the smart battery 22a or 22b and connected to a source of AC electrical power external to the computer system 20, provides electrical power for energizing operation of the computer system 20, and for recharging the smart battery 22a or 22b then remaining in the computer system 20. Because the AC-DC converter 502 physically occupies space in the computer system 20 provided for one or the other of the smart batteries 22a or 22b, installation of the AC-DC converter 502 into the computer system 20 eliminates any need to carry the AC-DC converter 71 that is separate from the computer system 20 itself. Moreover, because the computer system 20 retains either the smart battery 22a or 22b, operation of the computer system 20 may still be energized by battery power in an absence of an external AC power source.

To permit energizing the computer system 20 by the AC-DC converter 502, the embodiment of the computer system 20 depicted in FIGS. 11a and 11b adds to the operating-power switches 64a–64c and to the battery-recharge switches 76a and 76b a pair of internal-AC-power switches 504a and 504b. The selector controller 82, 82' or 82" adapted for controlling operation of the AC-DC converter 502, depicted in greater detail in FIG. 12, supplies to the internal-AC-power switches 504a and 504b power-switch control-signals 506, indicated by a dashed line in FIGS. 11a and 11b. The power-switch control-signals 506 originate at switch drivers 146h and 146i that constitute internal-power-converter switch-drivers which the selector controller 82", depicted in FIG. 12, adds to the switch drivers 146a–146g of the selector controller 82 depicted in FIG. 3. Upon closure of the internal-AC-power switch 504a or 504b in response to a signal from the selector controller 82, 82' or 82", identical to the AC-DC converter 71 the AC-DC converter 502 supplies electrical power to the node 74 through either one or the other of a pair of protection diodes 508a and 508b.

To permit the selector controller 82, 82' or 82" and/or the smart-battery charger 26 or the charger 108 to detect substitution of the AC-DC converter 502 for one of the smart batteries 22a or 22b, the AC-DC converter 502 includes a 500 ohm ("Ω") to 3,000 Ω resistor, not illustrated in any of the FIGS. Upon replacement of the smart battery 22a or 22b with the AC-DC converter 502, the 500–3,000 Ω resistor connects to the thermistor output-signal-line 102a or 102b instead of the thermistor included in the smart battery 22a or 22b. The selector controller 82, 82' or 82" and/or the smart-battery charger 26 or the charger 108 interpret detection of a 500–3,000 Ω resistance connected to the thermistor output-signal-line 102a or 102b as a smart battery 22a or 22b that is too hot for charging. Accordingly, upon sensing such a resistance connected to the thermistor output-signal-line 102a or 102b, the selector controller 82, 82' or 82" and/or the smart-battery charger 26 or the charger 108, via the battery-recharge switch 76a or 76b, immediately effect a disconnection of the output terminal 75 or 75' respectively of the smart-battery charger 26 or the charger 108 from the battery-terminal line 65a or 65b to which the AC-DC converter 502 connects.

While including the 500–3,000 Ω resistor in the AC-DC converter 502 permits immediate, passive detection of its presence by the selector controller 82, 82' or 82" and/or the smart-battery charger 26 or the charger 108 even if the AC-DC converter 502 is not connected to an external AC power source, the selector controller 82, 82' or 82" further responds to the presence of an excessively large voltage at the battery-voltage input-terminals 78a or 78b, i.e. a voltage that is three (3.0) volts or more higher than the maximum voltage provided by the smart batteries 22a and 22b, by activating the appropriate internal-AC-power switch 504a or 504b to couple the battery-terminal line 65a or 65b to the node 74 via the corresponding protection diode 508a or 508b. Referring again to FIG. 7, if in decision block 324 the voltage present at the AC-power-sensing input 79 fails to indicate that the AC-DC converter 71 is supplying power to the computer system 20 then the state machine 132, in decision block 522, determines from an excessively high voltage present at the battery-voltage input-terminal 78a if the AC-DC converter 502 has replaced smart battery 22a and is supplying power to the computer system 20. If the AC-DC converter 502 has replaced smart battery 22a and is supplying power to the computer system 20, the state machine 132 in processing block 524 via the power-switch control-signals 506 activates the internal-AC-power switch 504*a* to couple electrical power available on the battery-terminal line 65*a* to the power-input terminal 68 or 68' respectively of the smart-battery charger 26 or the charger 108 via the series connected protection diode 508*a*, node 74, and resistor 73. Concurrently, the state machine 132 stores data into the POWER_BY nibble 122*ab* that turns off smart battery 22*a* for energizing the operation of the computer system 20, and also stores data into the CHARGE nibble 122*ac* that activates charging of smart battery 22*b*. The state machine 132 then re-enters the wait state awaiting another event affecting the smart batteries 22*a* or 22*b* or the AC-DC converter 71.

If in decision block 522 the voltage present at the battery-voltage input-terminal 78*a* fails to indicate that the AC-DC converter 502 has replaced smart battery 22*a*, then the state machine 132, in decision block 526, determines from an excessively high voltage present at the battery-voltage input-terminal 78*b* if the AC-DC converter 502 has replaced smart battery 22*b* and is supplying power to the computer system 20. If the AC-DC converter 502 has replaced smart battery 22*b* and is supplying power to the computer system 20, the state machine 132 in processing block 528 via the power-switch control-signals 506 activates the internal-AC-power switch 504*b* to couple electrical power available on the battery-terminal line 65*b* to the power-input terminal 68 or 68' respectively of the smart-battery charger 26 or the charger 108 via the series connected protection diode 508*b*, node 74, and resistor 73. Concurrently, the state machine 132 stores data into the POWER_BY nibble 122*ab* that turns off smart battery 22*b* for energizing the operation of the computer system 20, and also stores data into the CHARGE nibble 122*ac* that activates charging of smart battery 22*a*. The state machine 132 then re-enters the wait state awaiting another event affecting the smart batteries 22*a* or 22*b* or the AC-DC converter 71. If in decision block 526 the state machine 132 fails to find the AC-DC converter 502 supplying power to the computer system 20, the state machine 132 also re-enters the wait state awaiting another event affecting the smart batteries 22*a* or 22*b* or the AC-DC converter 71.

Although the present invention has been described in terms of the presently preferred embodiment, it is to be understood that such disclosure is purely illustrative and is not to be interpreted as limiting. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. A controller for a battery selector that is adapted for use with at least two smart batteries, said smart batteries being capable of providing electrical power for energizing operation of a portable device and also providing battery-state data via a bus to a host computer included in the portable device, the battery-state data provided by the smart batteries including a battery-condition alarm-message which indicates that the smart battery that transmits the battery-condition alarm-message has experienced a pre-specified conditions the controller comprising:

smart-battery-selection switch-drivers at least equal in number to the smart batteries included in the portable device, each smart-battery-selection switch-driver being associated with a specific smart battery and providing a battery selection-signal for effecting a selection of the associated smart battery which causes the selected smart battery to energize operation of the portable device;

an internal-power-converter switch-driver associated with at least one of the smart batteries to select, for supplying electrical power to energize operation of the portable device, an external electrical power-source that is coupled to the portable device by an internal electrical-power converter which physically replaces one of the smart batteries;

a control electronic-circuit that controls operation of the smart-battery-selection switch-drivers and the internal-power-converter switch-driver for selecting to energize operation of the portable device at any instant either:

a. the smart battery associated with a particular smart-battery-selection switch-driver; or b. the external electrical power-source that is coupled to the portable device by the internal electrical-power converter;

an internal-voltage-conversion sensing-circuit for sensing voltage provided by the external electrical power-source that is coupled to the portable device by the internal electrical-power converter, if the voltage sensed by said internal-voltage-conversion sensing-circuit exceeds a pre-established threshold, the controller transmitting a signal to said control electronic-circuit directing said control electronic-circuit to select the external electrical power-source that is coupled to the portable device by the internal electrical-power converter to energize operation of the portable device; and a bus-snooper circuit that independently of the host computer monitors the bus for the battery-condition alarm-message from the smart batteries, and that upon detecting the battery-condition alarm-message transmits a signal to said control electronic-circuit.

2. The controller of claim 1 wherein the smart-battery-selection switch-drivers, operating under control of said control electronic-circuit, provide battery selection-signals to select one of the smart batteries to energize operation of the portable device so that at any instant only one of said smart-battery-selection switch-drivers effects a selection of the associated smart battery to energize operation of the portable device;

wherein the battery-condition alarm-message detected by the bus-snooper circuit is a low-battery-capacity message; and wherein the signal transmitted by said bus-snooper circuit causes said control electronic-circuit to attempt selection of a different smart battery to energize operation of the portable device.

3. The controller of claim 1 further comprising a battery-voltage sensing-circuit for sensing smart-battery voltage independently from the smart batteries, the controller using the voltage thus sensed in attempting to select a different smart battery to energize operation of the portable device.

4. The controller of claim 1 wherein the controller further include an external power-converter switch-driver for effecting a selection of an electrical power-source that is external to the portable device to energize operation of the portable device, said control electronic-circuit also controlling operation of said external power-converter switch-driver for effecting a selection of the external electrical power-source so that at any instant an ensemble of said smart-battery-selection switch-drivers and said external power-converter switch-driver selects either one of the smart batteries or the electrical power-source to energize operation of the portable device, and:

wherein the controller further comprises an external-voltage sensing-circuit for sensing voltage provided by the external electrical power-source; and if the voltage sensed by said external-voltage sensing-circuit exceeds a pre-established threshold, said external-voltage sensing-circuit transmitting a signal to said control electronic-circuit directing said control electronic-circuit to select the external electrical power-source to energize operation of the portable device.

5. The controller of claim 1 wherein said smart-battery-selection switch-drivers, operating under control of said control electronic-circuit, select one of the smart batteries included in the portable device for recharging so that at any instant only one smart battery is being recharged;

wherein the battery-condition alarm-message detected by the bus-snooper circuit is an overcharge battery-condition message; and wherein the signal transmitted by said bus-snooper circuit causes said control electronic-circuit to attempt selection of a different smart battery for recharging.

6. The controller of claim 5 further comprising a battery-charging-rate circuit which receives a battery charging-rate signal that indicates if a smart battery is being charged at a fast or a slow rate, the controller permitting a power-management computer program executed by the host computer to retrieve data indicative of such battery charging-rate signal from the controller.

7. The controller of claim 1 wherein the controller stores operating-mode data that in a first state activates response of the controller to operation of said bus-snooper circuit, and in a second state deactivates response of the controller to operation of said bus-snooper circuit.

8. The controller of claim 1 wherein smart-battery-selection switch-drivers, operating under control of said control electronic-circuit, provide battery selection-signals to select one of the smart batteries to energize operation of the portable device so that at any instant only one of said smart-battery-selection switch-drivers effects a selection of the associated smart battery to energize operation of the portable device;

wherein the controller further includes a timer for establishing a pre-established time interval; and wherein, if said bus-snooper circuit fails to receive a battery-condition alarm-message throughout the pre-established time interval established by said timer, said control electronic-circuit causes said control electronic-circuit to attempt selection of a different smart battery.

9. A battery powered portable device comprising:

a host computer;

at least two smart batteries, said smart batteries being capable of providing electrical power for energizing operation of the portable device;

a bus to which said smart batteries may be coupled and over which said smart batteries may transmit battery-state data to said host computer, the battery-state data provided by said smart batteries including a battery-condition alarm-message which indicates that said smart battery that transmits the battery-condition alarm-message has experienced a pre-specified condition; and a battery selector that is coupled to said smart batteries, said battery selector including a controller that has:

smart-battery-selection switch-drivers at least equal in number to the smart batteries included in the portable device, each smart-battery-selection switch-driver being associated with a specific smart battery and providing a battery selection-signal for effecting a selection of the associated smart battery which causes the selected smart battery to energize operation of the portable device;

an internal-power-converter switch-driver associated with at least one of the smart batteries to select, for supplying electrical power to energize operation of the portable device, an external electrical power-source that is coupled to the portable device by an internal electrical-power converter which physically replaces one of the smart batteries;

a control electronic-circuit that controls operation of the smart-battery-selection switch-drivers and the internal-power-converter switch-driver for selecting to energize operation of the portable device at any instant either:

a. said smart battery associated with a particular smart-battery-selection switch-driver; or b. the external electrical power-source that is coupled to the portable device by the internal electrical-power converter;

an internal-voltage-conversion sensing-circuit for sensing voltage provided by the external electrical power-source that is coupled to the portable device by the internal electrical-power converter, if the voltage sensed by said internal-voltage-conversion sensing-circuit exceeds a pre-established threshold, the controller transmitting a signal to said control electronic-circuit directing said control electronic-circuit to select the external electrical power-source that is coupled to the portable device by the internal electrical-power converter to energize operation of the portable device; and a bus-snooper circuit that independently of said host computer monitors said bus for the battery-condition alarm-message from said smart batteries, and that upon detecting the battery-condition alarm-message transmits a signal to said control electronic-circuit.

10. The battery powered portable device of claim 9 wherein smart-battery-selection switch-drivers of the controller included in said battery selector, operating under control of said control electronic-circuit, select one of said smart batteries to energize operation of the portable device so that at any instant only one of said smart-battery-selection switch-drivers effects a selection of the associated smart battery to energize operation of the portable device;

wherein the battery-condition alarm-message detected by the bus-snooper circuit is a low-battery-capacity message; and wherein the signal transmitted by said bus-snooper circuit causes said control electronic-circuit to attempt selection of a different smart battery to energize operation of the portable device.

11. The battery powered portable device of claim 9, wherein the controller included in said battery selector includes a battery-voltage sensing-circuit for sensing smart-battery voltage independently from the smart batteries, the controller using the voltage thus sensed in attempting to select a different smart battery to energize operation of the portable device.

12. The battery powered portable device of claim 9 being adapted to be energized by an electrical power-source supplied externally to the portable device; and wherein, in addition to said smart-battery-selection switch-drivers associated with said smart batteries included in the portable device, switch-drivers of the controller further include an external power-converter switch-driver for effecting a selection of an electrical power-source that is external to the portable device to energize operation of the portable device, said control electronic-circuit also controlling operation of said external power-converter switch-driver for effecting a selection of the external electrical power-source so that at any instant an ensemble of said smart-battery-selection switch-drivers and said external power-converter switch-driver selects either one of the smart batteries or the electrical power-source to energize operation of the portable device, and:

wherein the controller further comprises an external-voltage sensing-circuit for sensing voltage provided by the external electrical power-source; and if the voltage sensed by said external-voltage sensing-circuit exceeds a pre-established threshold, said external-voltage sensing-circuit transmitting a signal to said control electronic-circuit directing said control electronic-circuit to select the external electrical power-source to energize operation of the portable device.

13. The battery powered portable device of claim 9 wherein smart-battery-selection switch-drivers of the controller included in said battery selector, operating under control of said control electronic-circuit, select one of the smart batteries included in the portable device for recharging so that at any instant only one smart battery is being recharged;

wherein the battery-condition alarm-message detected by the bus-snooper circuit is an overcharge battery-condition message; and wherein the signal transmitted by said bus-snooper circuit causes said control electronic-circuit to attempt selection of a different smart battery for recharging.

14. The battery powered portable device of claim 13 wherein the controller included in said battery selector includes a battery-charging-rate circuit which receives a battery charging-rate signal that indicates if a smart battery is being charged at a fast or a slow rate, the controller permitting a power-management computer program executed by said host computer to retrieve data indicative of such battery charging-rate signal from the controller.

15. The battery powered portable device of claim 9 wherein the controller included in said battery selector stores operating-mode data that in a first state activates response of the controller to operation of said bus-snooper circuit, and in a second state deactivates response of the controller to operation of said bus-snooper circuit;

wherein said host computer of the portable device may operate in a Suspend mode in which the portable device including said host computer consumes a lesser amount of electrical power because certain portions of said portable device including said host computer are turned-off; and wherein the controller stores first state operating-mode data transmitted from said host computer to the controller before said host computer enters the Suspend mode whereby the operating-mode data stored in the controller activates response of the controller to operation of said bus-snooper circuit while said host computer is in the Suspend mode.

16. The battery powered portable device of claim 9 wherein smart-battery-selection switch-drivers of the controller included in said battery selector, operating under control of said control electronic-circuit, select one of said smart batteries to energize operation of the portable device so that at any instant only one of said smart-battery-selection switch-drivers effects a selection of the associated smart battery to energize operation of the portable device;

wherein the controller included in said battery selector further includes a timer for establishing a pre-established time interval; and wherein, if said bus-snooper circuit fails to receive a battery-condition alarm-message throughout the pre-established time interval established by said timer, said control electronic-circuit causes said control electronic-circuit to attempt selection of a different smart battery.

* * * * *

UNITED STATES PATENT AND TRADEMARK OFFICE
CERTIFICATE OF CORRECTION

PATENT NO.   : 5,903,764
DATED        : May 11, 1999
INVENTOR(S)  : You-Yuh Shyr, Kwang H. Liu and Sterling Du It is certified that error appears in the above-identified patent and that said Letters Patent is hereby corrected as shown below:

<u>Title page,</u>
Change "[73]   Assignee  Micro International Ltd., Taipei, Taiwan" to
-- [73]   Assignee   O2 Micro International Ltd., Grand Cayman, Cayman Islands, B.W.I. (KY) --

Signed and Sealed this

Eighteenth Day of March, 2003

JAMES E. ROGAN
*Director of the United States Patent and Trademark Office*